(12) United States Patent
Harrison et al.

(10) Patent No.: US 11,481,077 B2
(45) Date of Patent: Oct. 25, 2022

(54) TOUCH-SENSING SYSTEM INCLUDING A TOUCH-SENSITIVE PAPER

(71) Applicant: Carnegie Mellon University, Pittsburgh, PA (US)

(72) Inventors: Christopher Harrison, Pittsburgh, PA (US); Yang Zhang, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 16/978,954

(22) PCT Filed: Mar. 26, 2019

(86) PCT No.: PCT/US2019/024112
§ 371 (c)(1),
(2) Date: Sep. 8, 2020

(87) PCT Pub. No.: WO2019/191126
PCT Pub. Date: Oct. 3, 2019

(65) Prior Publication Data
US 2021/0373707 A1    Dec. 2, 2021

Related U.S. Application Data

(60) Provisional application No. 62/761,499, filed on Mar. 26, 2018.

(51) Int. Cl.
*G06F 3/044*  (2006.01)
*G06F 3/03*  (2006.01)
*H03K 17/96*  (2006.01)

(52) U.S. Cl.
CPC .......... *G06F 3/0445* (2019.05); *G06F 3/0321* (2013.01); *H03K 17/9622* (2013.01);
(Continued)

(58) Field of Classification Search
None
See application file for complete search history.

(56) References Cited

U.S. PATENT DOCUMENTS 9,395,851 B2   7/2016  Mikladal et al.
9,762,235 B2   9/2017  Stone
(Continued)

OTHER PUBLICATIONS

International Preliminary Report on Patentability in International Appln. No. PCT/US2019/024112, dated Sep. 29, 2020 8 pages.
(Continued)

*Primary Examiner* — Aneeta Yodichkas
(74) *Attorney, Agent, or Firm* — Fish & Richardson P.C.

(57) ABSTRACT

A touch sensing system is configured to determine a state of a paper material indicative of a touch input on the paper material. The actions include receiving one or more values of features representing physical properties of a paper material. The system generates, by a pair of electrodes in a conductive material that is electrically connected with the paper material, an electric field in the conductive material. The paper material is configured to shunt current from the conductive material when the paper material is touched. The system measures the electric field in the conductive material in the conductive material. The system generates an approximation of the electric field in the conductive material. The system determines with a classifier a state of the paper material indicative of a touch input on the paper material.

21 Claims, 19 Drawing Sheets

(52) U.S. Cl.
CPC .............. *G06F 2203/04104* (2013.01); *H03K 2017/9613* (2013.01)

(56) References Cited

U.S. PATENT DOCUMENTS

| | | | |
|---|---|---|---|
| 2009/0135161 A1* | 5/2009 | Endo | G06F 3/04886 345/174 |
| 2009/0153519 A1* | 6/2009 | Suarez Rovere | G06F 3/041 345/173 |
| 2010/0155731 A1 | 6/2010 | Sun et al. | |
| 2012/0075226 A1* | 3/2012 | Andoh | G06F 3/04144 345/173 |
| 2016/0170522 A1 | 6/2016 | Slobodin et al. | |
| 2018/0039392 A1* | 2/2018 | Kim | G06F 3/04886 |
| 2018/0181245 A1* | 6/2018 | Beck | G06F 3/04883 |

OTHER PUBLICATIONS

International Search Report and Written Opinion in International Appln. No. PCT/US2019/024112, dated Jun. 5, 2019, 8 pages.

Schmeder et al., "Support vector machine learning for gesture signal estimation with a piezo-resistive fabric touch surface," Proceedings of the 2010 Conference of New Interfaces for Musical Expression, retrieved on May 20, 2019, retrieved from URL: http://www.educ.dab.uts.au/nime/proceedings/papers/Paper%20L1-L5/P244_Schmeder.pdf, 6 pages.

Zhang et al., "Electrick: low-cost touch sensing using electric field tomography," CHI 2017, retrieved on May 5, 2018, retrieved from URL: http://chrisharrison.net/projects/electrick/electrick.pdf, 14 pages.

Zhang et al., "Pulp nonfiction: low-cost touch tracking for paper," Proceedings of the 2018 CHI Conference on Human Factors in Computing Systems, 2018, 11 pages.

* cited by examiner

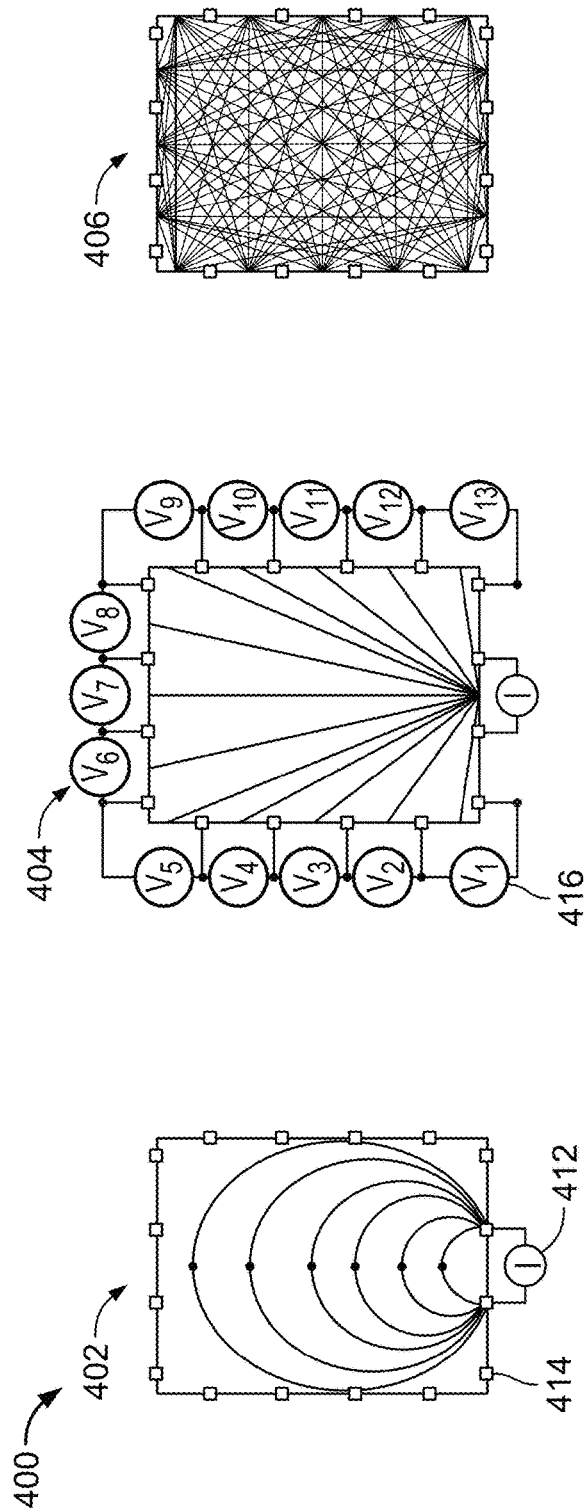
FIG. 4C
FIG. 4B
FIG. 4A
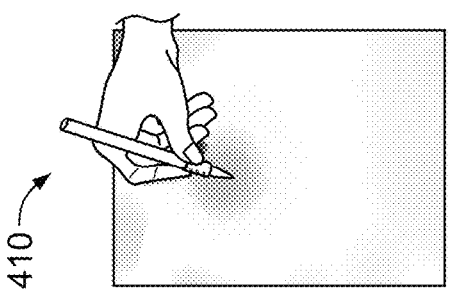
FIG. 4E
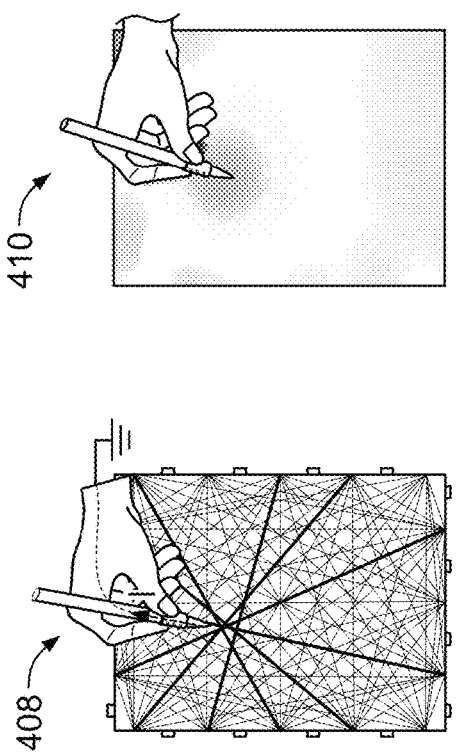
FIG. 4D

TOUCH-SENSING SYSTEM INCLUDING A TOUCH-SENSITIVE PAPER

CLAIM OF PRIORITY

This application is the national stage entry of International Patent Application No. PCT/US2019/024112, filed on Mar. 26, 2019, which claims priority under 35 U.S.C. § 119(e) to U.S. Patent Application Ser. No. 62/761,499, filed on Mar. 26, 2018, the entire contents of each of which are hereby incorporated by reference.

TECHNICAL FIELD

This application relates to Electrical Impedance Tomography (EIT), specifically to touch-enabled paper materials.

BACKGROUND

Generally, paper is not truly an interactive medium, but rather a passive medium.

Generally, paper is used passively to facilitate computational capabilities, for example, facilitating information retrieval (e.g., barcodes, QR codes, RFID tags), enhancing paper-based experiences (e.g., augmented reality with printed AR tags), and digitizing pen input. In these systems, the input on the paper is duplicated for reproduction in another medium for further processing by an external object (e.g., optical pen, RFID reader, barcode scanner, camera), and the paper itself is passive.

Touchscreen technologies are generally manufactured on a rigid substrate. For example, projective capacitive sensing, like that used in contemporary smartphones, uses a multi-layered, row-column matrix most often deposited onto glass. This means that most touch panels are relatively small and flat. In cases where irregular shapes or large areas have been made touch sensitive, the price tag is often significant—touchscreens above 75" typically cost thousands of dollars, and complex or flexible objects with touch-sensing capabilities are mostly research prototypes unavailable to consumers. The high cost and inflexibility has limited touch interaction from being adopted by a wider array of everyday objects, despite touch being an intuitive and popular input modality.

Generally, touchscreens are not integrated with a paper material that is removable from the touch sensing apparatus and also disposable. Generally, attempts have been made to imbue the paper with sensing capabilities. This is most frequently achieved by instrumenting paper with conductive traces (e.g., copper stickers/tape, printed inks) to enable capacitive touch-sensing elements, such as buttons and sliders. Such methods generally cannot support continuous touch tracking across the entire surface of a paper, and instead must be designed in accordance with content on the paper (i.e., a fixed design). Additionally, most of these methods are targeted for one-off DIY or end user applications, and are generally impractical for mass production, undermining one of the key qualities of paper's success: a cost so low it can be crumpled up and thrown away without an afterthought.

SUMMARY

The systems and methods of the touch sensing system described herein provide a low-cost and versatile sensing technique that enables touch input on paper surfaces, whether large or irregular. In some implementations, this is achieved by using electric field tomography sensing in concert with an electrically conductive layer that can be easily and cheaply added to objects and surfaces, including paper materials. The touch-enabled interfaces of these paper materials can be small, on the order of a dozen centimeters square, or large, on the order of several meters square. The touch-enabled surfaces of the paper can be directly touched.

The touch sensing system includes electrodes in contact with the conductive paper, which covers the desired interactive area, to inject a small current. This results in an electric field distributed inside the paper. The electrodes can be attached anywhere on the paper. For the simplicity of deployment, our system attaches electrodes to the periphery of conductive paper. When a user's finger touches on the desired interactive area, it draws a fraction of the current to the ground. This results in a distortion in the electric field distribution, which can be sensed using the electrodes. Greater details of this sensing principle will be described below. The sensor data is transmitted wirelessly, allowing the sensors and board to be fully contained within an object and eliminating the need for external sensing infrastructure (e.g., depth cameras).

The systems and methods described herein are related to Electrical Impedance Tomography (EIT). Note that EIT has other names such as Electrical Resistance Tomography (ERT), or Electrical Capacitance Tomography (ECT). Here, the term EIT is used to represent all systems that utilize on electrical changes to reconstruct an image of the interior structure of an object by sensing non-invasively from the exterior surface. EIT applications include respiratory monitoring, underground detection, and biological inspection. In the human computer interaction domain, the technology can be used in a hand-gesture-sensing smartwatch.

In some implementations, EIT can be used in conjunction with materials that alter their local impedance when pressure is applied by a finger such as piezo-resistive films, multi-layer meshes, and tactile sensor arrays. For example, EIT can be used to create touch sensitive skins for robots. Irregular geometries are supported.

Although the systems and methods described herein comprise tomography, the sensing principles are very different from standard EIT—the methods and systems do not sense changes in a material substrate (impedance in the case of EIT), but is rather can be based on a user's finger (or another device, such as a stylus) shunting injected current. This sensing mechanism enables use of leverage very different materials for the conductive domain, which in turn entails different fabrication methods and use cases not previously contemplated due to difficulty and cost.

The systems and methods described herein are related to Electric Field (EF) sensing. EF sensing generally uses the air as a medium, enabling free-space interactions such as finger tracking, motion sensing, and activity recognition. In short, when an object (which represents a large charge sink) enters the sensed area, the EF current distribution is disturbed. The system deduces the position of a disturbance by using measurements from electrodes (e.g., peripheral electrodes). Systems typically perform the localization through regression, rather than tomographic reconstruction.

In an aspect, he touch sensing system is configured to perform operations including receiving data including one or more values of features representing physical properties of a paper material. The operations further include generating, by a first pair of electrodes at a first location in a conductive material that is electrically connected with the paper material, an electric field in the conductive material, the paper material being configured to shunt current from the conductive material when the paper material is touched. The operations include generating measurement data by measuring, by one or more second pairs of electrodes, the electric field in the conductive material at one or more second locations in the conductive material. The operations include generating, based on the measurement data, an approximation of the electric field in the conductive material. The operations include selecting a classifier based on the one or more values of the features representing the physical properties of the paper material and the approximation of the electric field in the conductive material. The operations include determining, based on applying the classifier to the approximation of the electric field, a state of the paper material indicative of a touch input on the paper material.

In an aspect, the state of the paper material is indicative of the touch input on the paper material is determined to be either touched or not touched. In response to determining that the state of the paper material is touched, the touch sensing system can be configured to determine the location of the touch input on the paper material.

In an aspect, the classifier comprises a first classifier configured for determining the state of the paper material as touched or not touched. The classifier also comprises a second classifier for determining the location of the touch input on the paper material, and the first classifier is different from the second classifier.

In an aspect, determining the location of the paper material that is touched includes a tracking of a continuous touch on the paper material. In some implementations, determining the location of the touch input on the paper material includes determining a location of a disturbance in the electric field of the conductive material that causes the electric field to diverge, at the location of the disturbance, from a baseline electric field of the conductive material. The disturbance in the electric field can be caused by an electric current that is shunted at the location of the disturbance.

In an aspect, the electric current is shunted by a user's touch. In an aspect, the electric current is shunted by a writing instrument.

In some implementations, the actions of the touch sensing system include determining the baseline electric field of the conductive material by obtaining the measurement data when the paper material is not being touched. In some implementations, the actions of the touch sensing system include, in response to generating the measurement data, selecting one of the one or more second pairs of electrodes for generating another electric field in the conductive material. The touch sensing system 100 is configured to generate additional measurement data, using the first pair of electrodes and the one or more second pairs of electrodes that were not selected. The touch sensing system 100 is configured to combine the measurement data with the additional measurement data to generate cross-sectional measurement data. The approximation of the electric field is based on the cross-sectional measurement data. The data includes the one or more values of features representing physical properties of the paper material comprises a finite element model (FEM) of the paper material.

In an aspect, generating the measurement data includes a tomographic reconstruction of the electric field throughout the conductive material.

In an aspect, the touch sensing system is configured to perform actions including applying a first regression model for a first dimension of the paper material and applying a second regression model for a second dimension of the paper material. Applying the classifier can include executing a neural network to perform operations including generating feature inputs each including a sample of the measurement data; generating weights data based on the data including the one or more values of the features representing physical properties of the paper material; combining, at each stage of the neural network, each of the feature inputs with the weights data to generate output data; and applying the classifier to the output data.

In some implementations, the touch sensing system is configured to perform actions including executing a support vector machine, where one or more features of the support vector machine comprise the measurement data.

In an aspect, the conductive material comprises a surface coat material having a resistivity between 500Ω and 50MΩ. The actions of the touch sensing system can include multiplexing the first pair of electrodes and the one or more second pairs of electrodes between a current generating state and a voltage measuring state. The actions of the touch sensing system can include determining, based on applying the classifier, that two or more regions of the paper material are simultaneously being touched.

In an aspect, a physical property of the paper material comprise one or more of a resistivity, a thickness, a material type, a shape, and a size.

In an aspect, the touch sensing system includes a conductive material and a paper material that is electrically connected with the conductive material. The paper material can be configured to shunt current from the conductive material when the paper material is touched. The touch sensing system includes a plurality of electrodes affixed to the conductive material. The touch sensing system includes a multiplexing device configured to switch a state of electrodes of the plurality between a current-projecting functionality state and a voltage measuring functionality state. The touch sensing system includes a signal generator. The touch sensing system includes one or more data processing devices configured to perform operations including causing the multiplexing device to switch a pair of electrodes of the plurality from the voltage measuring functionality state to the current-projecting functionality state; controlling the signal generator to generate, via the pair of electrodes, an electric field in the conductive material; measuring, via one or more pairs of the electrodes of the plurality in the voltage measuring functionality state, one or more voltages representing the electric field in the conductive material to generate cross-sectional measurement data; approximating, based on the cross-sectional measurement data, the electric field in the conductive material; and classifying, based on the approximation, one or more regions of the paper material into one of a touched state or a not-touched state.

The systems and methods described include one or more of the following advantages.

The touch sensing system enables touch tracking (e.g., fully continuous touch tracking) across a paper's surface, opening new ways to consider paper. The input method can support both fingers and writing implements, such as pens, pencils and brushes. The touch-sensitive paper is low cost. In extremely small volumes, individual sheets were created for little as 30 cents, not including the reusable portions of the touch sensing system that integrates with the touch-sensitive paper. The touch-sensitive paper can be used as a touch-sensitive interface for a computing device, and still be inexpensive enough for single-use in a manner similar to conventional paper.

The touch sensing system including the touch-sensitive paper allows for accurate determination of what portion of the paper is being touched by a user, either by a user's finger or with a stylus, such as a writing instrument. A user can write on the paper in a typical manner and record an accurate digital representation of the writing, immediately having both a physical copy of the writing and a digital copy that matches the written copy. This reduces the need, for example, to scan documents for reproducing a physical signature, among other similar applications.

The details of one or more embodiments are set forth in the accompanying drawings and the description below. Other features and advantages will be apparent from the description and drawings, and from the claims.

BRIEF DESCRIPTION OF THE DRAWINGS

FIGS. 3-4 show example processes for sensing touch by the touch sensing system of FIG. 1.

DETAILED DESCRIPTION

Figure 1:
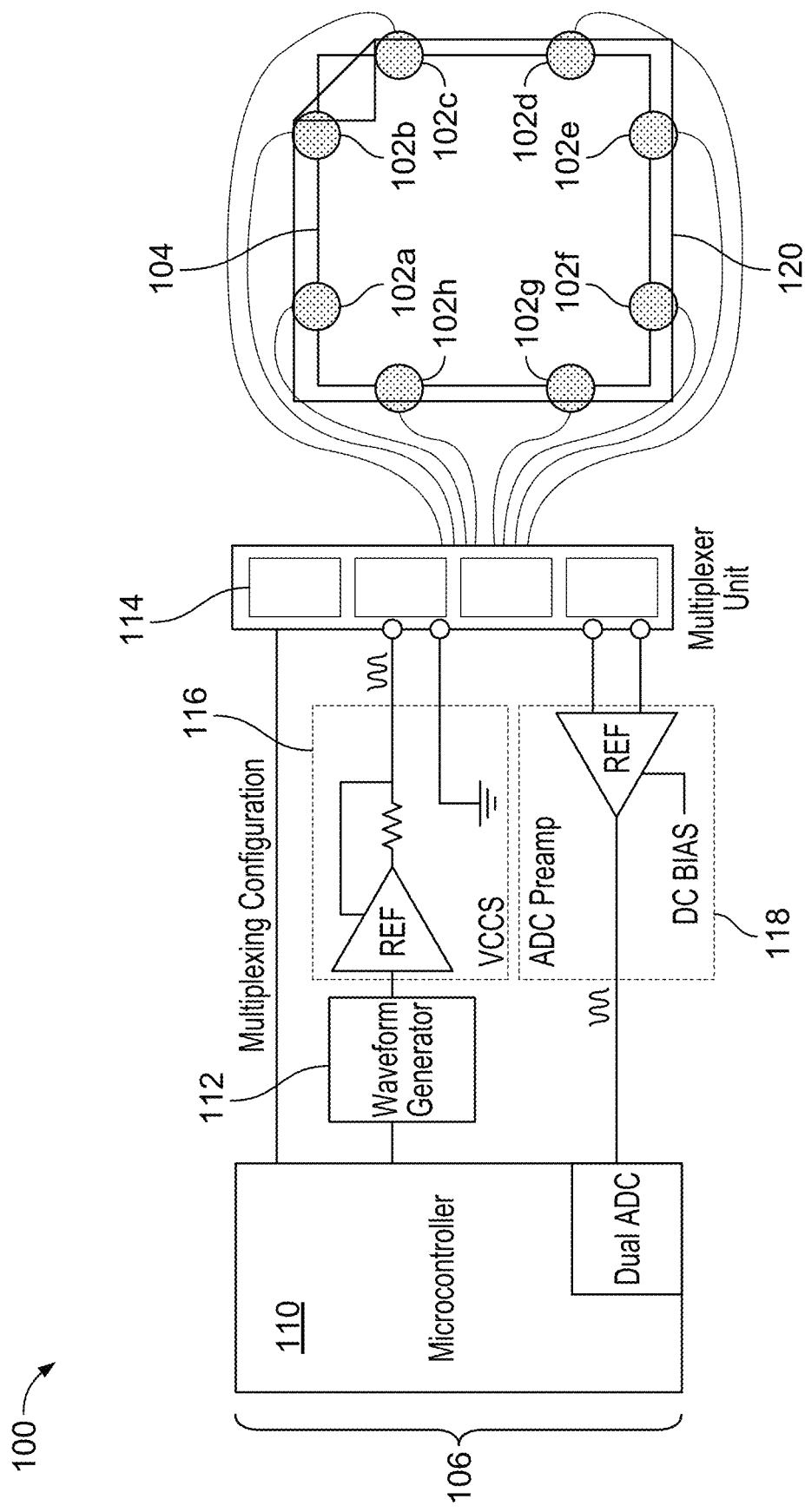
FIG. 1 shows a schematic view of the touch sensing system.

FIG. 1 shows a schematic view of a touch sensing device 100 including a touch-sensitive paper 120. The touch sensing device 100 is illustrated with eight electrodes 102, but other numbers of electrodes can be used, such as four, six, ten, twelve, fourteen, sixteen, thirty-two, and so forth. The electrodes 102a-h (collectively electrodes 102) are affixed to a conductive material 104. The electrodes 102 are in communication with a data processing system 106 (e.g., a sensing board). The touch sensing system 100 shown in FIG. 1 is a representative system for illustrative purposes, but as described below, the touch sensing system can include conductive materials of irregular geometries manufactured from one or more of several materials. For example, the touch sensing system 100 can include electrodes 102 that are positioned on the conductive material 104 in a non-uniform manner. In some implementations, a touch interface of the touch sensing system 100, which is a portion of the conductive material 104, can be on any portion of the conductive material 104, and need not be surrounded by electrodes 102 on the periphery as shown in in FIG. 1.

The touch-sensitive paper 120 includes a paper material combined with a conductive material. The touch-sensitive paper 120 of the touch sensing system 100 is configured to interface with the touch sensing system but also be removable from the touch sensing system and be disposable. Generally the, the touch-sensitive paper 120 is compatible with high-volume, low-cost production.

Conductive materials of the touch-sensitive paper 120 have several features. The conductive material of the touch-sensitive paper 120 is generally a low-cost material. Materials with high cost (e.g., silver inks) or un-sealable fabrication processes (e.g., vapor deposition) are generally unsuitable for the touch-sensitive paper 120. The conductive materials of the touch-sensitive paper 120 are configured to integrate with the paper without damaging the paper or otherwise rending the paper unsuitable for writing, such as causing the paper to curl, bubble, or otherwise deform. The conductive materials of the touch-sensitive paper 120 also have an approximately uniform thickness. Materials such as conductive silicone and conductive rubber are unsuitable due to challenges of constant thickness. Generally, the surface resistivity of the conductive material has a particular value, and is approximately 1 to 100 k$\Omega$/sq. Many common conductive films, such as off-the-shelf ITO, PEDOT and carbon fiber, are too conductive use as conductive materials.

Examples of conductive materials for including in the touch-sensitive paper 120 include Velostat and MG 838AR. Though these materials are shown to be effective conductive materials for the touch-sensitive paper 120, other materials with properties similar to these can be used in the alternative. The first material is Velostat, which includes a carbon-impregnated plastic sheeting which has a surface resistivity of ~70 k$\Omega$/sq. Velostat backing is adhered to paper, such as with a 3M multipurpose spray adhesive, to form the touch-sensitive paper 120 that is included in the touch sensing system 100. The second conductive material includes MG 838AR, which includes a carbon-loaded paint manufactured by MG Chemicals. A single coat of this paint results a surface resistivity of roughly 1 k$\Omega$/sq.

Figure 11:
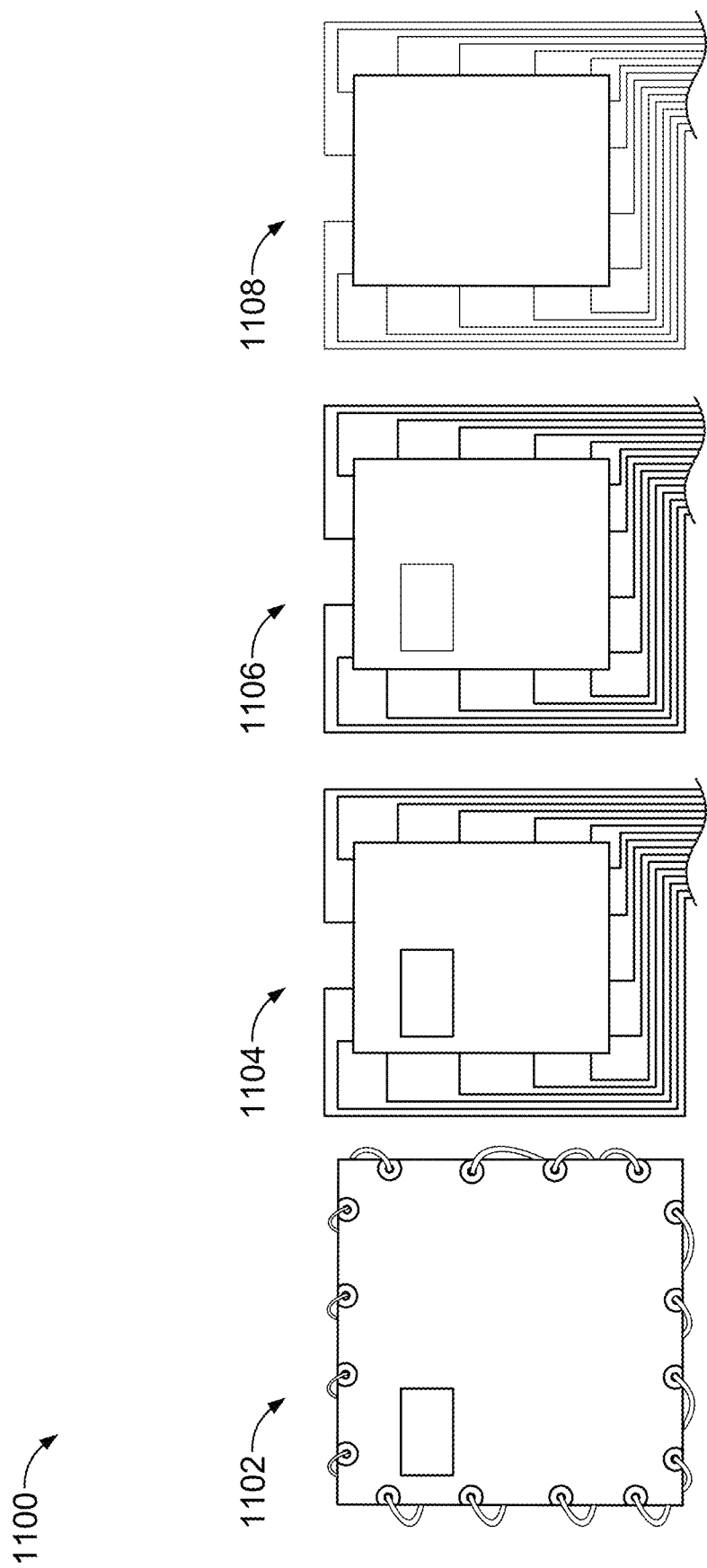
FIG. 11 shows different examples of fabricated touch sensing panels for use with touch-sensitive paper.

Referring to FIG. 11, an evolution 1100 from prototype to final design of the touch-sensitive paper 120 is shown. The earliest prototype 1102 of the touch-sensitive paper 120 included copper stickers adhered to the conductive backing and hand-soldered wires. This was replaced with integrated designs 1104, 1106, and 1108. For example, the touch-sensitive paper 120 designs of 1104, 1106, and 1108 include both the conductive substrate and all necessary traces. For the painted substrate 1104, a silk-screening process can be used, which suggests success with similar industrial scale print processes like offset printing. For a plastic sheet backing design, subtractive methods are the most effective. Specifically, a laser cutter can be used to cut a trace pattern, which is peeled from the paper 1106. A hybrid process using cut copper film for the traces is shown in paper 1108. Either process for paper 1106 or 1108 can be achieved at scale with die cutting, stamping, and so forth. In subsequent testing, plastic-backed paper with copper traces provided the best SNR and stability, and this became the reference design for the touch-sensitive paper 120.

Figure 12:
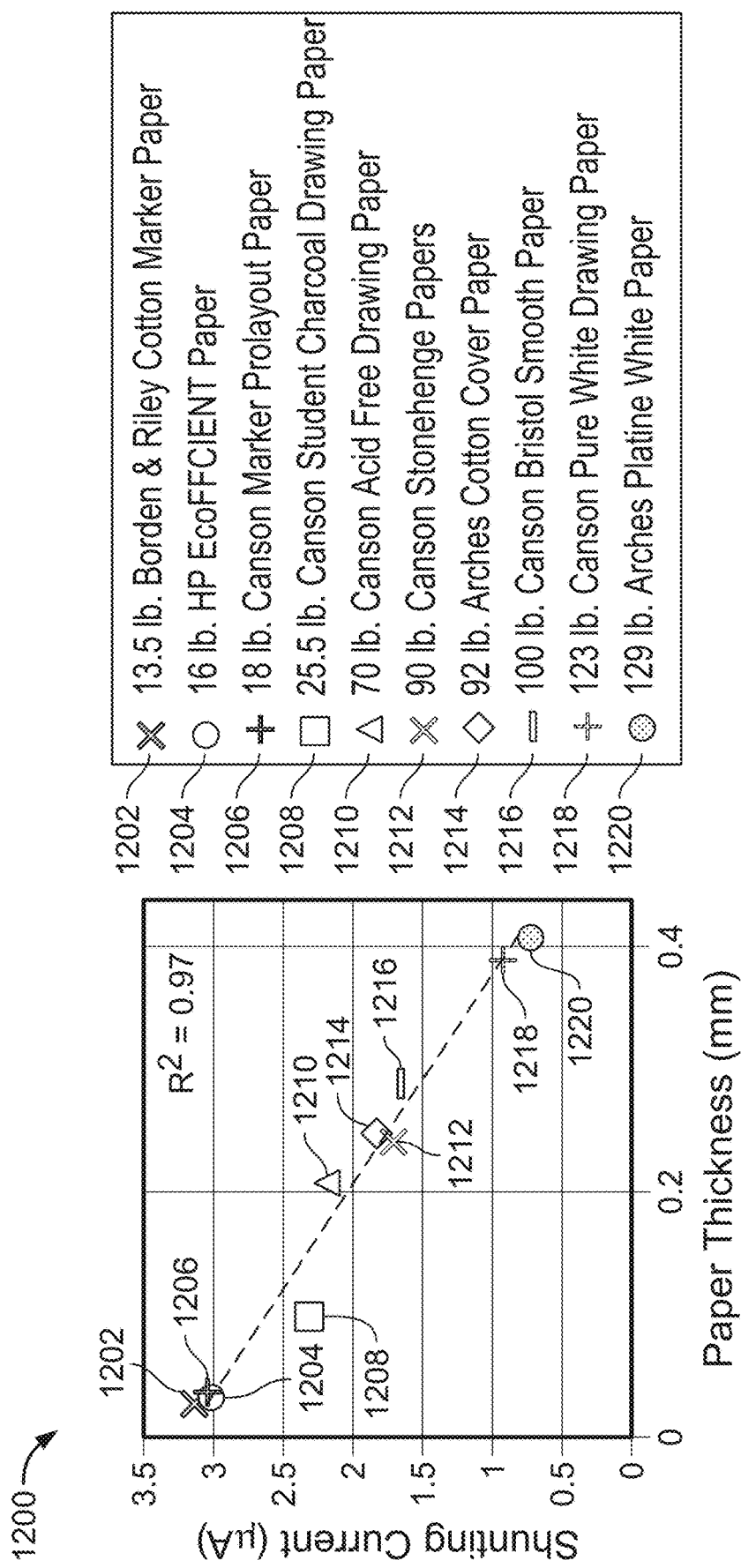
FIG. 12 includes a graph showing shunting current values for various paper thicknesses.

The touch-sensitive paper 120 includes a paper material layer that is combined with the conductive layer. Thickness is the primary factor correlating with performance of the touch-sensitive paper 120. Turning to FIG. 12, a graph 1200 shows a relationship between paper thickness and shunting current values. The $R^2$ value for this relationship is shown as 0.97. This shows that the strength of capacitive coupling is linearly affected by the thickness of the dialectic paper layer. Graph 1200 shows the results of the measured shunting current through the finger for ten paper samples ranging in thickness from 0.03 mm (13.5 lbs.) to 0.41 mm (129 lbs.). Although thinner paper is generally better, there is a tradeoff in opacity if sheets are too thin. For example, super thin tracing or tissue papers were found to be too thin for effective use. In some implementations an HP EcoFFICIENT 16 lb. printer paper 1204 was selected as the prototype implementation, which is bright white, offers excellent signal, and costs roughly 1 cent per sheet. The paper materials tested included Borden and Riley cotton marker paper 1202, HP EcoFFICIENT paper 1204, Canson marker prolayout paper 1206, Canson student charcoal drawing paper 1208, Canson acid-free drawing paper 1210, Canson Stonehenge papers 1212, Arches cotton cover paper 1214, Canson Bristol smooth paper 1216, Canson pure white drawing paper 1218, and Arches Platine white paper 1220. Though these particular papers were tested, papers with similar properties can be substituted.

Figure 13:
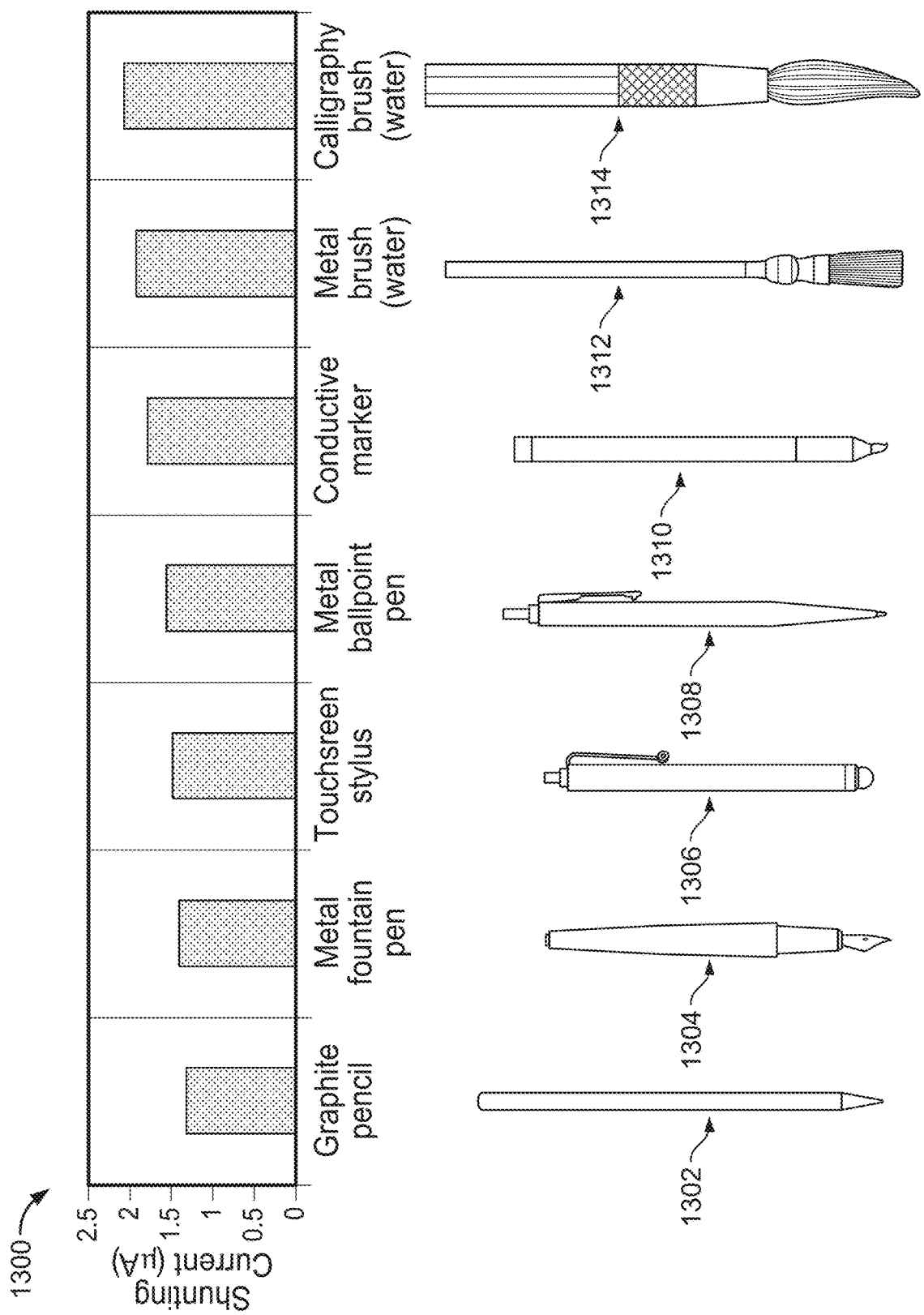
FIG. 13 includes a graph showing shunting current values for various writing instruments for use with touch-sensitive paper of the touch sensing system of FIG. 1 and depictions of examples of the writing instruments.

Turning to FIG. 13, writing elements were tested for use with the touch sensing system 100. The writing element is configured to mark the touch-sensitive paper 120 and also provide a shunt current to the paper for touch sensing by the touch sensing system 100. Generally, to enable shunting, a tip of a writing implement is electrically connected to a user's body (e.g., where grasped by the user). This is a similar approach as used for passive touchscreen styluses, which naturally work with the touch sensing system 100. Some implements include both a conductive body and conductive tip, such as a graphite pencil, a metal ballpoint pen, and a metal brush with a wet tip.

Seven example writing instruments were identified, and their shunting currents are measured in the same manner as the paper materials and shown in graph 1300. In these examples, five of the seven instruments required no additional instrumentation (e.g., off-the-shelf). These include a graphite pencil 1302, a metal fountain pen 1304, a metal ballpoint pen 1308, a touchscreen stylus 1306, and a metal brush 1312. These instruments have both a conductive body and a conductive tip, (e.g., made of metals, conductive rubber, or brushes dipped in water/paint). The conductive marker 1310 and a calligraphy brush 1314 are augmented with a conductive grip that couples to the tip or ink reserve. Example materials for augmenting the writing instruments 1310, 1314 include stainless steel and copper tape. In some implementations, transparent coatings such as ITO or PEDOT can be used to preserve the appearance for aesthetics. For example, a thin protective coat of ITO or PEDOT is applied on top of the conductive grip with no effect on the shunting current. Overall, there was not a large spread in shunting current across the tested implements, which ranged from 1.3 µA to 2.1 µA. This compares to 3.0 µA when the finger is touching the paper. As a representative writing implement, the graphite pencil was selected, which performed the worst of the set, for the user study described in relation to FIGS. 14-17B.

Returning to FIG. 1, the interface of the touch sensing system 100 includes the touch-sensitive paper 120 that is configured for being interacted with by a user of the touch sensing system. The interface of the touch sensing system includes a monolithic and contiguous interface, rather than a pattern. A pattern, for example, includes an array of touch-sensitive nodes or other discrete sensing devices, such as microelectronic devices, in the interface of the patterned system. Various approaches are used to determine a location of a touch input or several simultaneous touch inputs on the monolithic interface, such as tomography, as described in relation to FIGS. 3-5.

Figure 2:
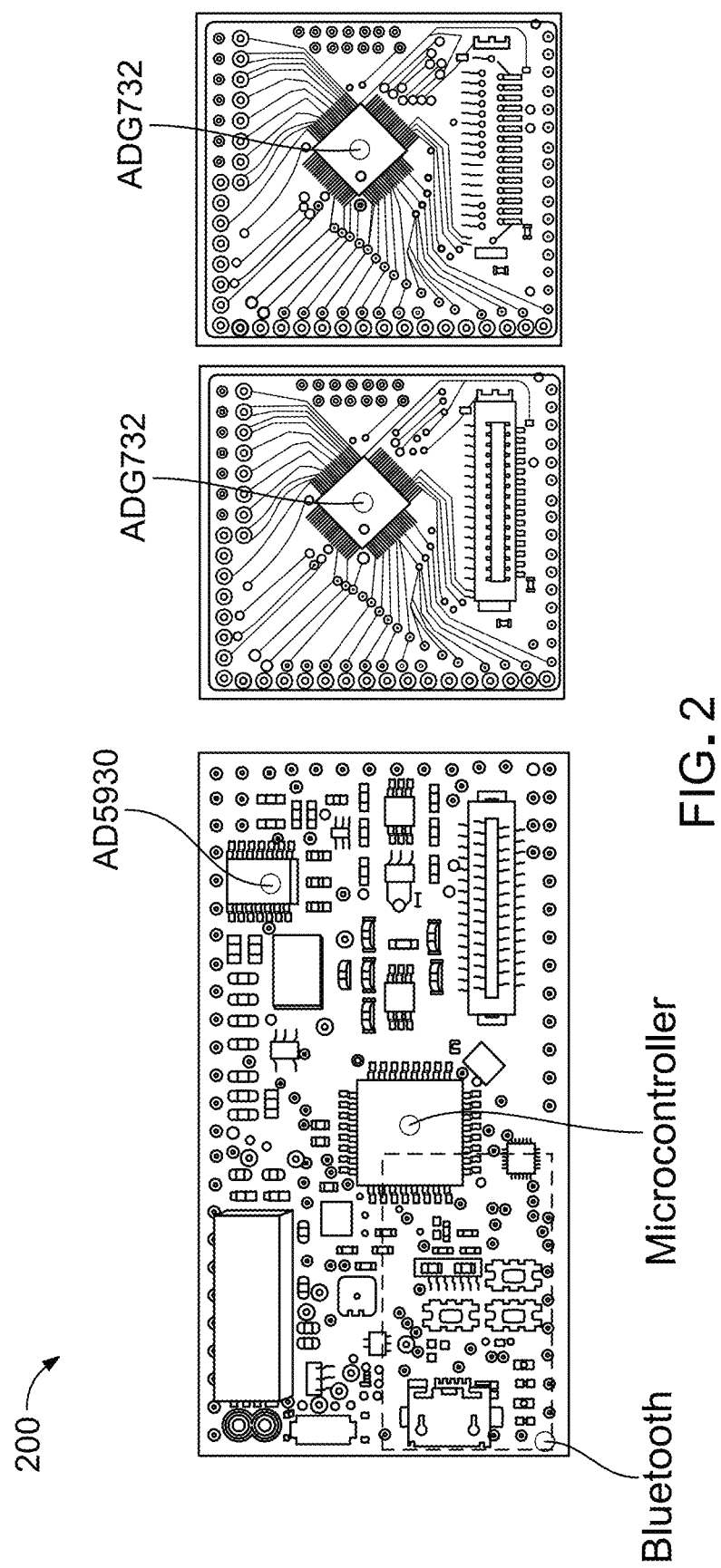
FIG. 2 shows example sensing boards for the touch sensing system of FIG. 1.

An example of the data processing system 106 is shown in a schematic. The data processing system 106 can include a microcontroller 110, a waveform generator 112 (e.g., a signal generating device), and one or more multiplexers 114 in communication with the electrodes 102. For example, the data processing device 106 can be built around a Cortex M4 microcontroller running at 96 MHz (MK20DX256VLH7), powered by Teensy 3.2 firmware, as shown in FIG. 2. The data processing system 106 includes a voltage controlled current source 116 (VCCS), direct digital synthesis (DDS) integrated circuit, and ADC preamplifier 118. The one or more multiplexers 114 enable cross-sectional measurements. In some implementations, the data processing system 106 can include a Bluetooth module to transmit data.

FIG. 2 shows an example of a sensing board 200. A motherboard with the micro-processor is shown as well as two daughter boards with multiplexer units. An AD5930 DDS and an AD8220-based Voltage-controlled current source (VCCS) can be used to generate the electric field. In some implementations, the DDS is configured to output 200 kHz sinusoidal waves. The signal is then fed into the VCCS to output a constant AC current. The sensor can drive up to 6 $V_{pp}$ to maintain constant AC current excitation, depending on the load impedance.

A pair of 32-to-1 multiplexers connect the VCCS terminals to two electrodes, forming a current-projecting electrode pair. Another pair of multiplexers connects two other electrodes (i.e. voltage-measuring pair) to the preamp buffer terminals. This electrode selection flexibility also affords us the flexibility to vary the number of electrodes used (chiefly 8, 16, or 32).

The measured signal can be amplified with a preamp to maximize the dynamic range of the ADC. In some implementations, a high pass filter is included with a 79.6 kHz cutoff to dampen ambient EM noise, such as fluorescent light ballasts (i.e. 50 kHz) and power-line noise (i.e. 60 Hz). The input signal is then biased by AVDD/2 (1.65 V) and sampled by the microcontroller's ADCs at 4 MHz with 12-bit resolution. Two ADCs in an interleaved DMA mode to achieve this high sampling rate by the data processing system 106.

The data processing system 106 is configured to select, by the multiplexers, a current-projecting electrode pair one or more voltage-measuring electrode pairs. The data processing system 106 is configured to pause 100 µs for the DC bias on the AC coupling capacitors to stabilize. The data processing system 106 then collects 200 samples (roughly 10 periods of the 200 kHz excitation signal) for a root-mean-square (RMS) computation. In some implementations, these foregoing steps constitute a single voltage measurement (taking ~137 µs in total). The data processing system 106 then selects the next voltage-measuring electrode pair, reconfiguring the multiplexers accordingly.

After the data processing system 106 collects all measurements in the current-projecting configuration, the data processing system 106 selects the next current-projecting pair and repeats the above procedure. Once the data processing system completes one frame of measurements, the cross sends the values over Bluetooth to a laptop for further processing. Table 1 notes the number of measurements required when using different electrode counts, which also defines the system frame rate.

TABLE 1

| Number of Electrodes | 8 | 16 | 32 |
| --- | --- | --- | --- |
| Number of Measurements req. per Frame | 40 | 208 | 928 |
| Sensing Frame Rate (Hz) | 181 | 35 | 8 |

Figure 3:
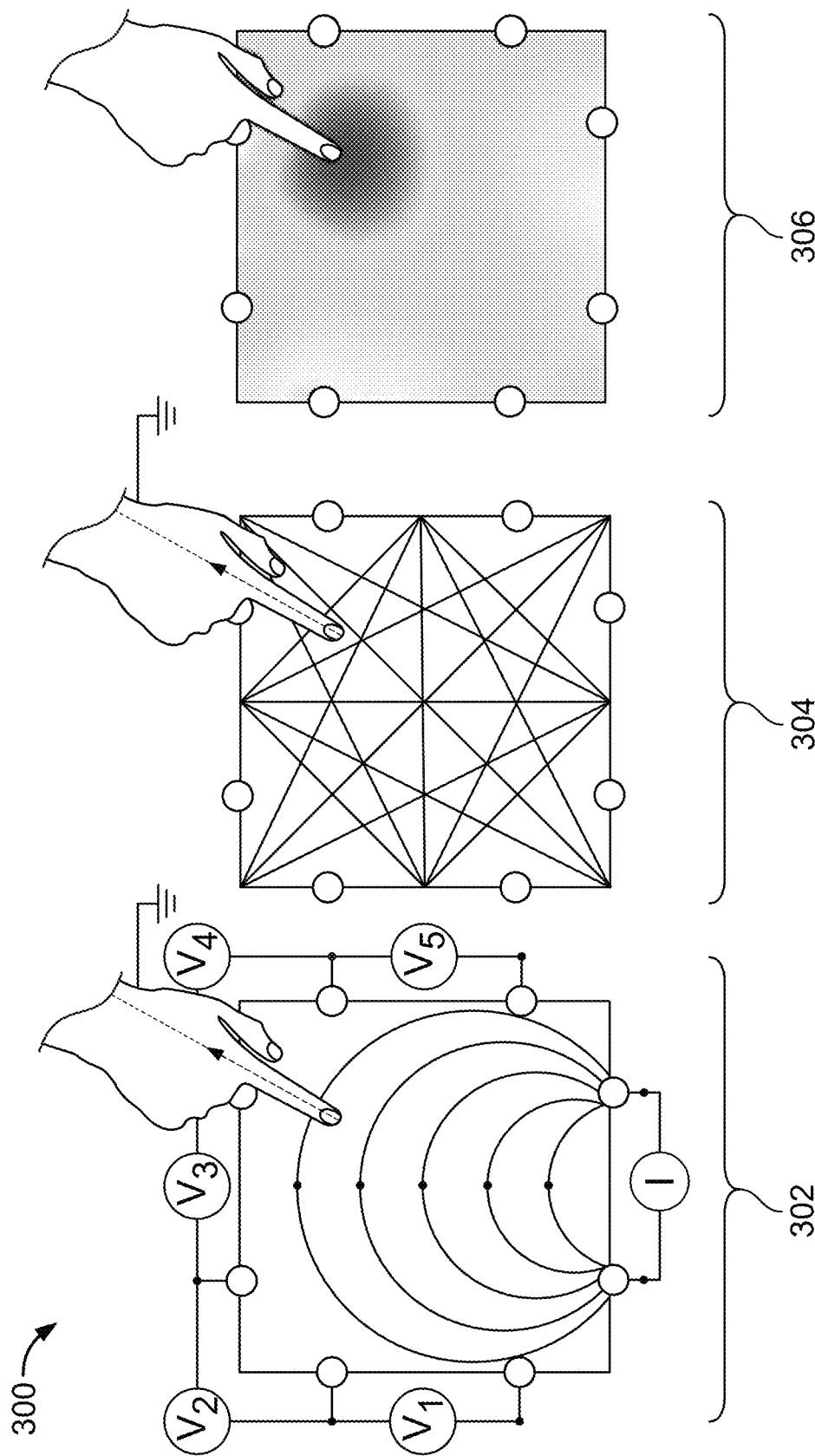

FIGS. 3-4 show example processes 300, 400 for sensing touch interactions with a touch interface comprising the conductive material 104 of the touch sensing system 100 of FIG. 1. Turning to FIG. 3, a current is inserted from one pair of electrodes and voltage from other pairs is measured. A mesh of cross-sectional measurements is taken. A reconstructed 2D touch-sensing image is created, where low and high current densities are shown. Low current densities are darker regions, which can be classified as "touched" regions. Lighter regains represent higher current densities, which can be classified as "not-touched" regions of the conducting material. The conductive material 104 is augmented with electrodes 102 placed on the conductive material (e.g., placed around the periphery of the desired interactive area). With this configuration, the touch sensing system performs a similar fundamental sensing operation as that used in four-pole EIT systems.

A small AC current is passed between a pair of adjacent electrodes (the emitter pair), creating an electric field in the conductive material, shown in diagram 302. The voltage difference is then measured at all other adjacent electrodes pairs (e.g., voltage-measurement pairs, receiver pairs, etc.). This process repeats for all combinations of emitter and receiver pairs, resulting in a mesh of cross-sectional measurements (e.g., measurement data), as shown in diagram 304.

In a conventional EIT system, this data would be used to estimate a 2D impedance distribution of an object interior, revealing regions with higher or lower impedance. However, as the coatings used in touch sensing system are homogenous, EIT is not applicable. Instead, the approach relies on the fact that a grounded object, such as a user's finger, will shunt some current to ground when it encounters an electric field (through capacitive coupling). The introduction of a charge sink distorts the electric field, characteristically altering the voltages measured at receiver pairs. The measurement data is then used to reconstruct the electric field distribution, which can recover the location of finger contacts, as shown in diagram 306. Since the system relies on capacitive coupling, it does not require a direct contact between a user's finger and the conductive substrate. This allows for a thin layer of non-conductive topcoat to be applied on the substrate for protection or atheistic purposes.

Selecting the correct resistivity for the surface is a crucial factor to the system's operation. If the resistivity is too high, the electric field will be very weak, making it hard to sense the field signal. However, if the surface resistivity is too low, the current shunted by the finger (a fairly high-impedance pathway) will be negligible, making changes hard to detect. In some implementations, the surface resistivity is approximately between 500Ω to 50MΩ per square.

FIG. 4 provides an overview of the EFT sensing scheme for interfacing the touch sensing system 100 with the touch-sensitive paper 120. The sheets of the touch-sensitive paper 120 are augmented with a conductive backing and have traces running to 16 evenly-spaced points running along the periphery of the interactive area. These traces run out to a common corner, to which our reusable sensor board connects. In some implementations the number of electrodes can vary from 16, but this number is used for illustrative purposes. The touch-sensitive paper 120 is shown at scene 402 having the electrodes 414 and a current source 412.

One frame of data is captured as follows. The sensor board (e.g., board 200 of FIG. 2) generates a 200 kHz, 6 Vpp AC excitation signal using an AD5930. This signal is injected into the touch-sensitive paper 120 at the conductive backing using a pair of peripheral points (current-projecting points near source 412. These points are selected using two on-board multiplexers, and can vary between the electrodes 414. The sensor board 200 then measures, shown at scene 404, the voltages at each other adjacent point pairings 416 (voltage-measuring pair), selected using a second set of multiplexers. This signal is sampled by the MK.20DX256VLH7 built-in ADCs at 4 MHz. Roughly ten periods of the excitation signal (e.g., 200 samples) are collected for a root-mean-square (RMS) computation. To create a mesh of cross-sectional measurements, the sensor board 200 rotates the current-projecting and voltage-measuring pairs until all combinations are measured, as shown in scene 406. In our sixteen-point configuration, this results in 208 RMS measurements, which are transmitted to a laptop over USB at roughly 35 FPS. When a finger (or conductive object in general, such as the writing instruments described in relation to FIG. 15) touches the touch-sensitive paper 120 surface, a small amount of current is shunted to ground due to capacitive coupling. This creates a localized voltage reduction, which manifests in the sensed mesh, shown in scene 408. Using tomographic reconstruction, the touch sensing system 100 can resolve touch location, as shown in scene 410.

Figure 5:
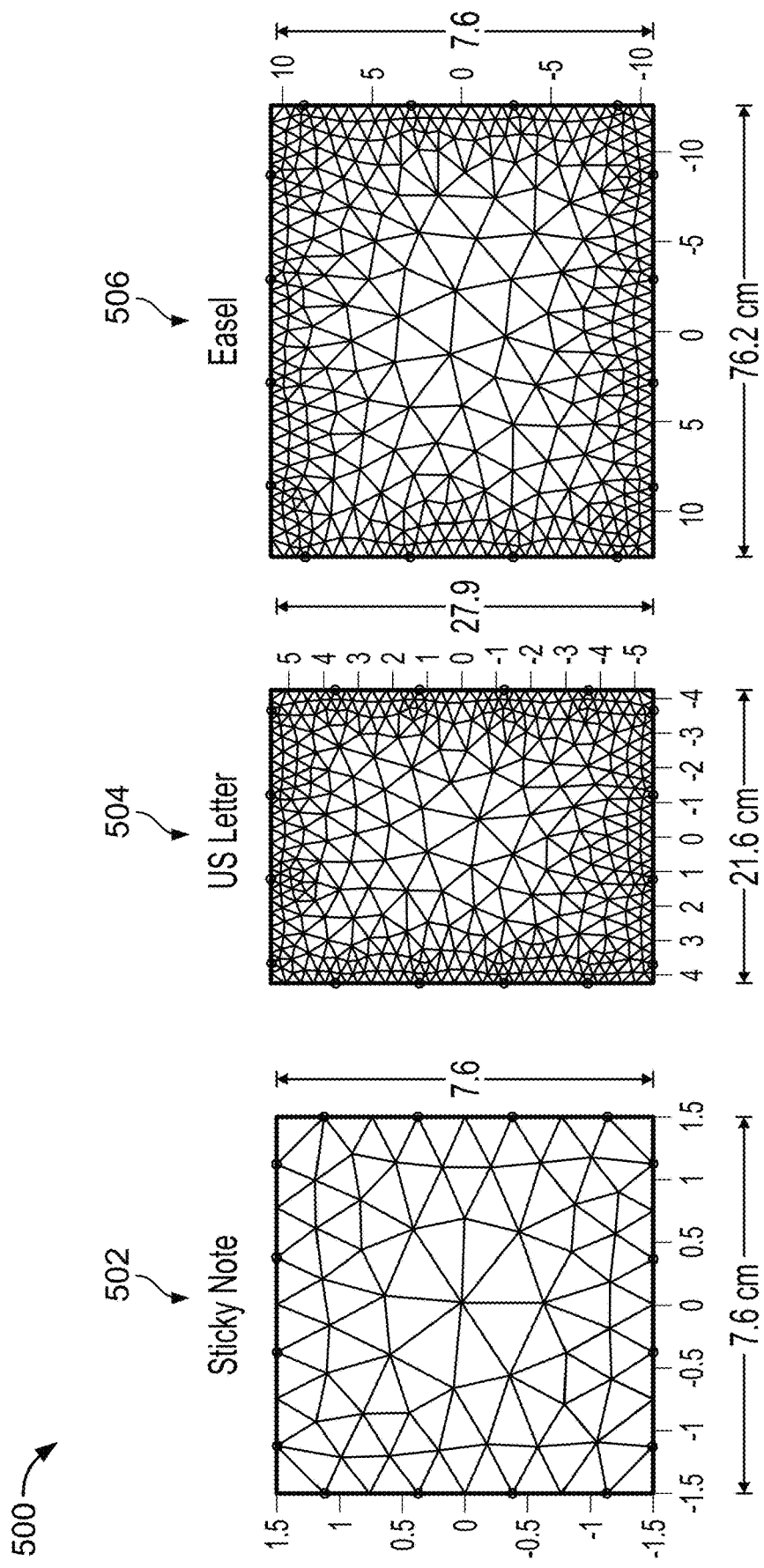
FIG. 5 shows examples of finite element models for different touch-sensitive paper configurations.

More specifically, the touch sensing system 100 generates a finite element model (FEM) for each size of paper that used. FIG. 5 shows example FEMs for three sizes of the touch-sensitive paper 120. A first FEM models a sticky note 502. A second FEM models a standard, U.S. letter size paper 504. A third FEM models an easel size paper 506. The FEM generation engine is built on the Eidors' implementation of a modified Gauss-Newton solver. This engine performs a one-time precomputation step to generate a reconstruction matrix, which takes about 2 seconds on a 2015 MacBook Pro (2.7 GHz Intel Core i5). After initialization, live image reconstruction requires a single matrix multiplication, in some examples taking roughly 0.13 milliseconds per frame.

Capacitive sensing is inherently sensitive to grounding condition. In the touch sensing system 100, both the sensor board 200 and the user's body capacitively couple to common ground (i.e., the Earth) to complete the circuit. Larger sensor ground planes offer stronger capacitive coupling, and thus result in a larger shunting current and superior signal-to-noise ratio (SNR). For each example discussed in this disclosure, the sensor board 200 was connected to a 15" MacBook Pro laptop over USB, which offers a reasonably substantial ground plane (though much weaker than e.g., plugging into a wall socket).

Figure 6:
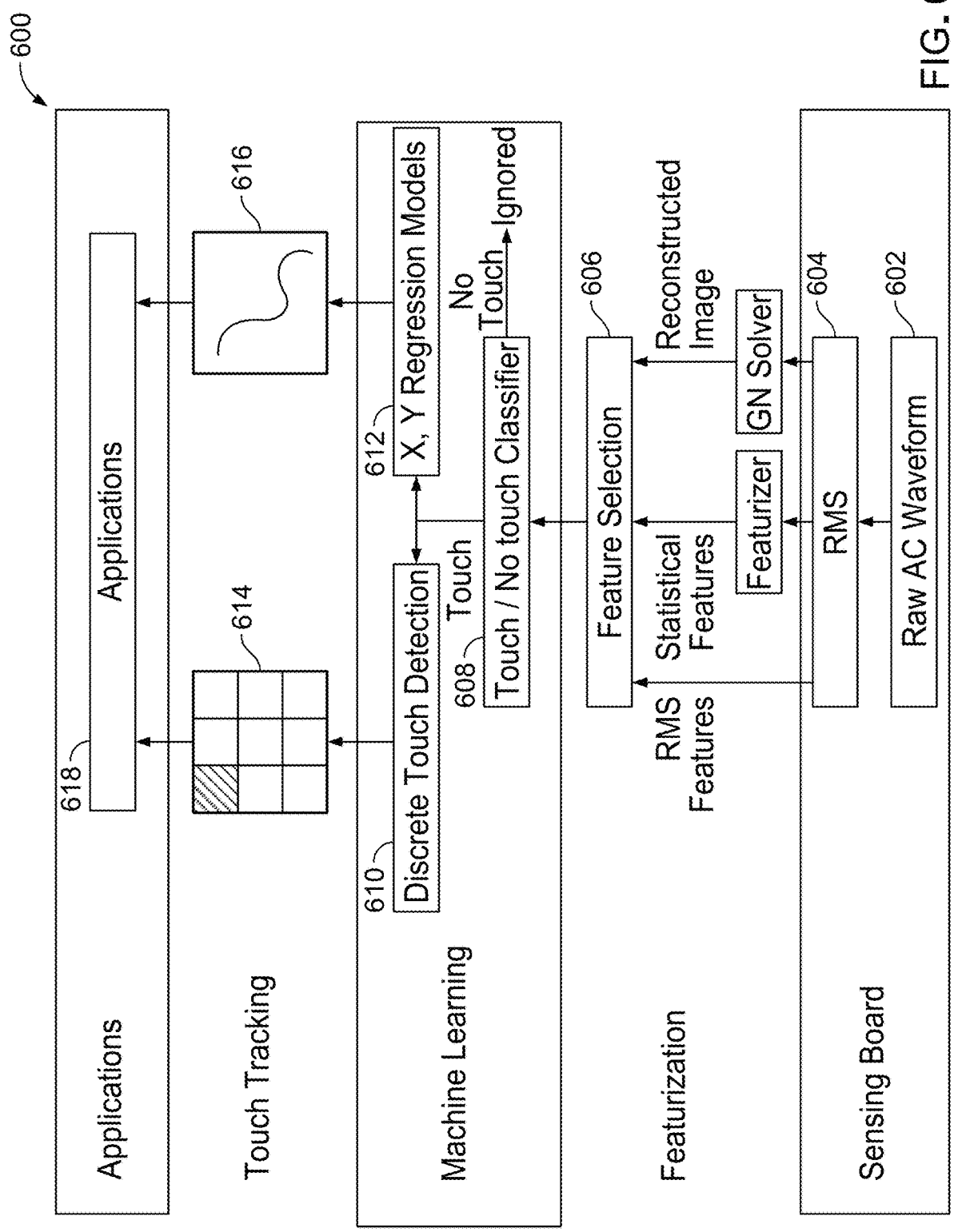
FIG. 6 shows a block diagram of a machine learning module for the touch sensing system of FIG. 1.

Turning to FIG. 6, a block diagram of a data processing pipeline of a machine learning module 600 for the touch sensing system of FIG. 1 is shown. To improve robustness against small variations in paper fabrication, as well as differences across users (e.g., finger contact area, grounding condition) and use environments (e.g., ambient electromagnetic interference), the touch sensing system 100 includes a machine learning pipeline. The machine learning pipeline is configured to naturally identify features that robustly characterize the signal across varying conditions, while ignoring noisy data.

The machine learning module 600 processes two sets of features. First, raw root-mean-square (RMS) values 604 derived from the alternating current (AC) waveform 602 that is measured from the touch-sensitive paper 120 are received by the module 600 from the board 200 and processed in the pipeline. Additionally, the machine learning module 600 processes the mean, max, min, standard deviation, centroid, and bin-wise subtractions of the AC waveform 602. Second, the machine learning module 600 processes the reconstructed values of the FEMs (e.g., FEM 502, 504, 506), which vary by paper size. Table 2 below shows examples of sizes for the touch-sensitive paper 120 for which FEMs are generated by the touch sensing system 100.

TABLE 2

Touch-sensitive paper properties.

| Paper Condition | Paper Dimensions | FEM Elements | Crosshair Configuration | Crosshair Spacing |
| --- | --- | --- | --- | --- |
| Sticky Note | 7.6 × 7.6 cm | 110 | 3 × 3 (9 total) | 15 mm |
| US Letter | 21.6 × 27.9 cm | 732 | 7 × 5 (35 total) | 30 mm |
| Easel | 76.2 × 63.5 cm | 714 | 4 × 5 (20 total) | 120 mm |

To prevent over-fitting, the touch sensing system 100 trains the classifiers of the machine learning module 600 on the most powerful 200 features selected by an information gain attribute evaluator 606 (e.g., by a Ranker search). The training occurs for each size of the touch-sensitive paper 120, and the resulting model is portable across all sheets of the same configuration.

The first-level classifier 608 is responsible for segmenting touch events: touch or not touch present (SMO, RBF kernel, y=0.07). If a touch is present, the features are passed to two touch tracking classifiers 610, 612 that operate in parallel. The first is a discrete-touch classifier 610 (SMO, RBF kernel, 'Y=0.07), trained on each crosshair location 614 (as though it was a button). The second classifier 612 includes regression models (SMO, RBF kernel, y=0.01) that produce a continuous X/Y touch estimation 616. Output from the classifiers 610, 612 is ultimately used to power end user applications 618.

Figure 7:
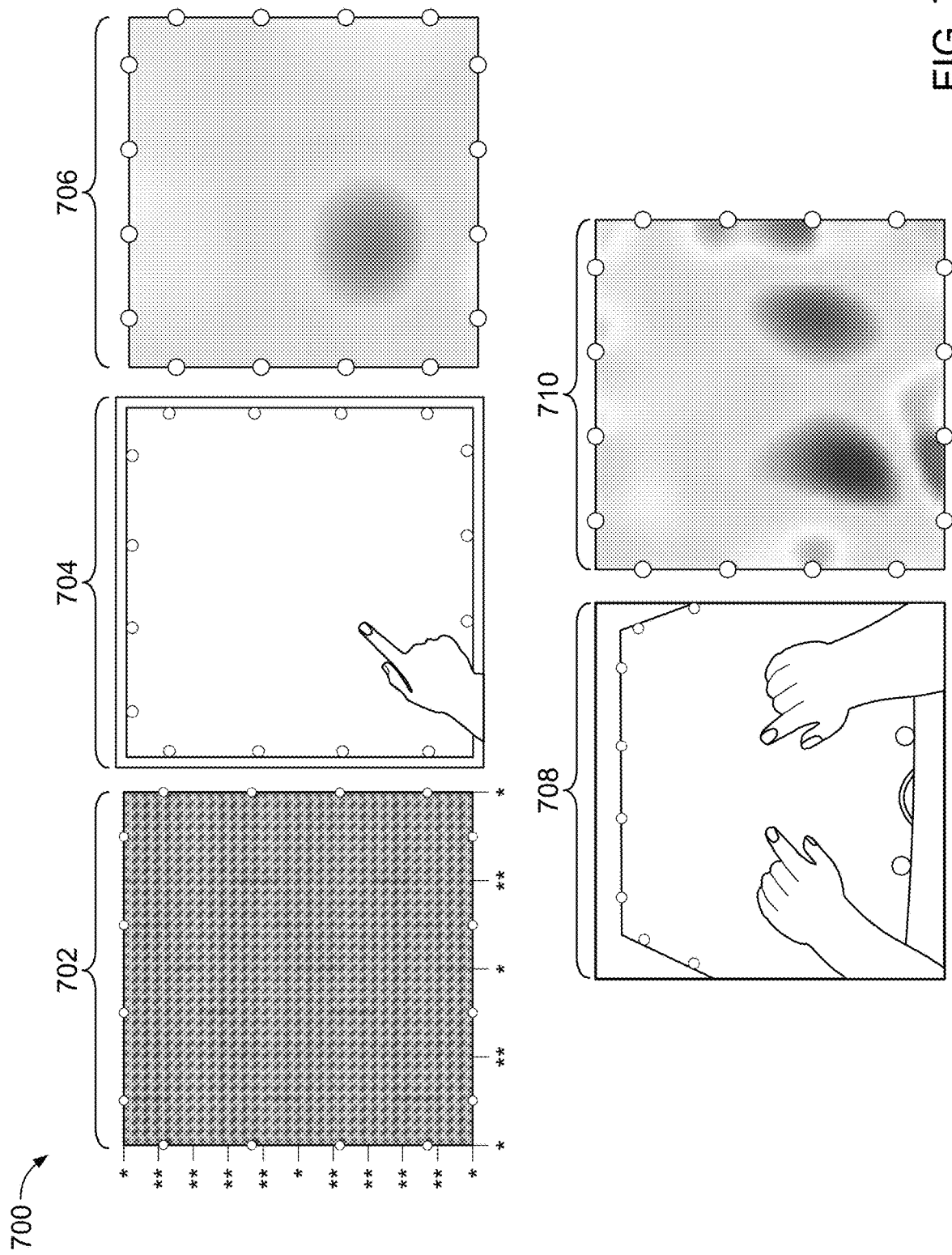
FIG. 7 shows an example of a response of the touch sensing system to one or more inputs.

The finger-tracking pipeline was initially developed using a fully realized tomographic reconstruction, to which standard computer vision "blob" tracking techniques were applied, as shown in images 700, 702, and 704 of FIG. 7. In one example, a single step Gauss-Newton method was used using a maximum a posteriori estimator to produce the tomographic reconstruction (provided by the EIDORS EIT toolkit).

The touch sensing system 100 is capable of high accuracy and multi-touch segmentation, as shown in images 706 and 708 of FIG. 7. In some implementations, construction of a finite element model 700 (FEM) for each object before use can be used to calibrate the touch sensing system. This is relatively straightforward for circular or square planar surfaces, but is a significant obstacle for ad hoc uses (e.g., rapidly fabricated prototypes) and complex geometries (which would require specialty 3D scanning equipment). This method is sensitive to small manufacturing variances, such as electrode adhesion and coating thickness.

In some implementations, as stated in relation to FIG. 6, machine learning can be used for calibration as an alternative means for determining the location of the touch on the touch-sensitive paper 120. Machine learning can offload much of this variability and complexity of the FEMs (e.g., FEMs 502, 504, 506). For example, the touch sensing system 100 can perform a simple one-time calibration on the touch-sensitive paper 120, from which machine learning models can be initialized. In addition to permitting arbitrary geometries, this process also innately captures and accounts for variances in construction.

Below are two example classification approaches. For sensing discrete touch positions (e.g., virtual buttons), the touch sensing system 100 uses a classification model (built using Weka, SMO, RBF kernel with γ=0.07). The same parameters are used for models that distinguish between touch states and no-touch states, and that distinguish between different touch locations. The touch state is the state of the touch-sensitive paper 120 in which the touch-sensitive paper is being contacted for a touch input. The no-touch state of the touch-sensitive paper 120 is the baseline state in which the touch-sensitive paper is not being touched for the touch input. To support continuous 2D touch tracking, the touch sensing system 100 uses two independent regression models (SMOReg, RBF kernel with γ=0.01) operating in parallel—one for X position and another for Y position.

The versatility of the touch sensing system 100 means that there are a wide range of combinations of the touch sensing system: different electrode counts (e.g., 8, 16, 32), example materials (Velostat,), surface sizes (e.g., 15×15, 30×30, 60×60 cm), and surface geometries when applicable (e.g., flat, curved, angular).

In some implementations, the classifiers can be a part of a neural network of the touch sensing interface. The neural network receives data representing a baseline electric field of the conductive interface or other calibration values as weights for synapses of the neural network. The neural network applies the raw measurements of the electric field (e.g., voltage measurements from various electrode pairs) as features into the neural network. The neural network outputs data that includes a determination of whether one or more regions of the interface of the touch sensing system are being touched or not touched.

In some implementations, the classifier can include a support vector machine (SVM). The feature inputs to the SVM include raw measurements of the electric field taken by the pairs of voltage-measuring electrodes. The SVM outputs data including a determination of whether a region of the interface is being touched or not touched.

The touch sensing system's accuracy was then tested live (i.e., no post hoc calibration, algorithm tweaks, data cleaning, etc.). Following the same procedure as above, where users moved sequentially through all touch points in a random order. This time, the system's live classification result was recorded along with the requested touch location for later classification-accuracy analysis. In the case of continuous touch tracking, real world coordinates were recorded (e.g., requested X, Y: 30.0, 60.0 mm; sensed X, Y: 31.2, 59.4 mm). These coordinates were later used to compute the Euclidean-distance error.

This testing procedure was repeated twice more, for three rounds in total. This four-round, training-then-test procedure was repeated for every condition in all five experiments. In total, the study took around 70 minutes.

Results are presented, as well as a post hoc study investigating sensing stability across users. All results figures use standard error for their error bars.

Touch/no-touch classification accuracy averaged 99.5% (SD=0.5) across all conditions and factors. The one significant outlier (p<0.05) from this average was the paper coated condition, which had a touch segmentation accuracy of 93.2%.

Figure 8:
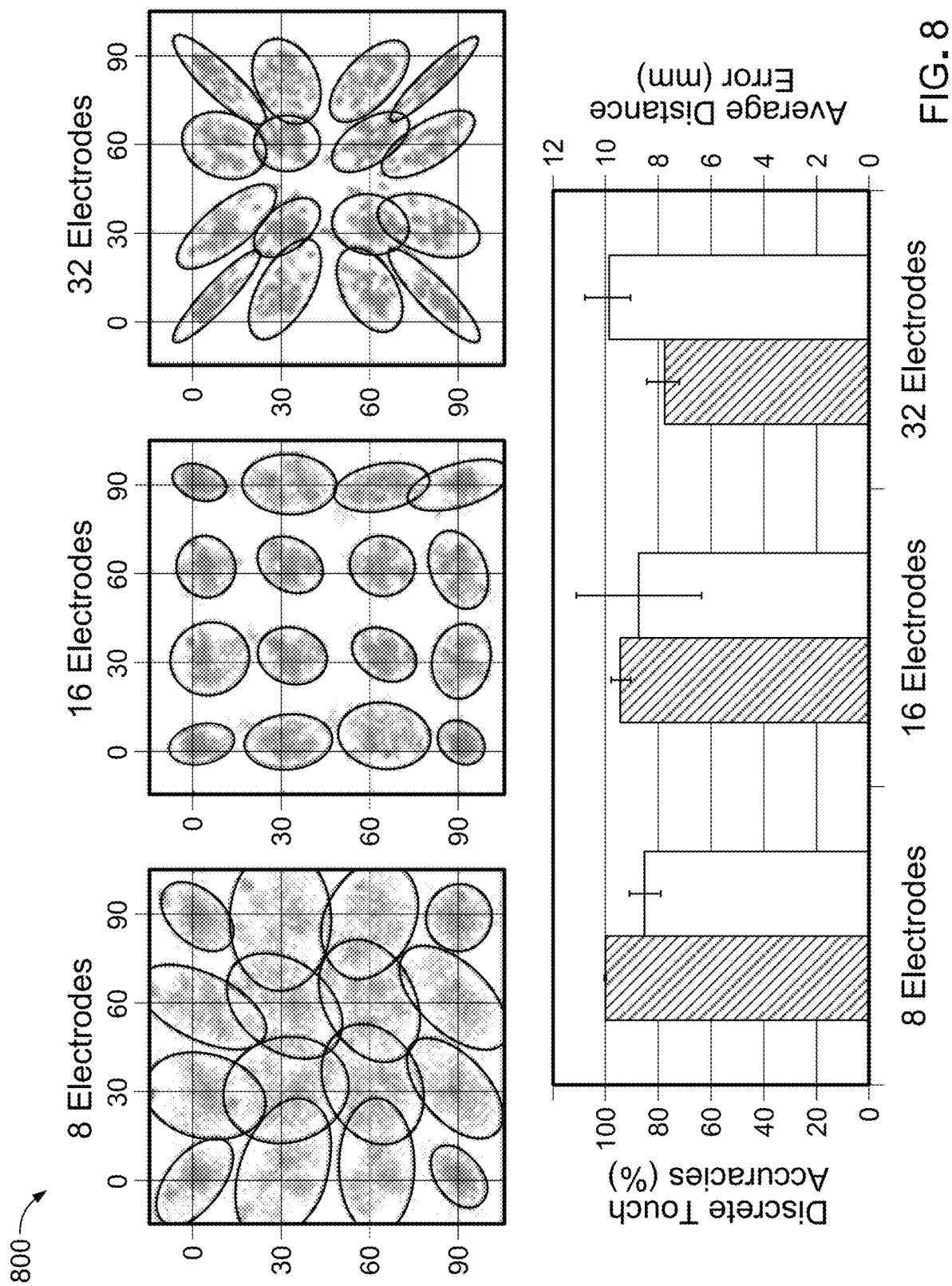
FIG. 8 shows evaluation results for an electrode count experiment.

The touch tracking accuracy across the three electrode count conditions is shown in data 800 of FIG. 8. The discrete touch location classifier achieved 90.7% (SD=12.0%) accuracy, while the continuous tracking had a mean distance error of 9.1 mm (SD=4.7). A two-tailed paired t-test showed that the 32-electrode condition was significantly worse than 8 electrodes (p<0.05) in the case of discrete tracking. As an additionally visualization, plot touch trials from all participants are plotted, along with 2σ ellipses drawn to scale.

The reduction in accuracy was chiefly due to the reduced distance between emitting electrode pairs. A shorter electrode separation means that the electric field does not project as far out into the conductive medium, which reduces the signal-to-noise ratio (SNR). Furthermore, the reduced distance between sensing pair electrodes similarly decreases terminal resistance, resulting in smaller voltage measurements, again reducing SNR. This result suggests that electrode count should be tuned according to surface size; e.g., for smaller interactive areas, lower electrode counts are likely to work better.

Figure 9:
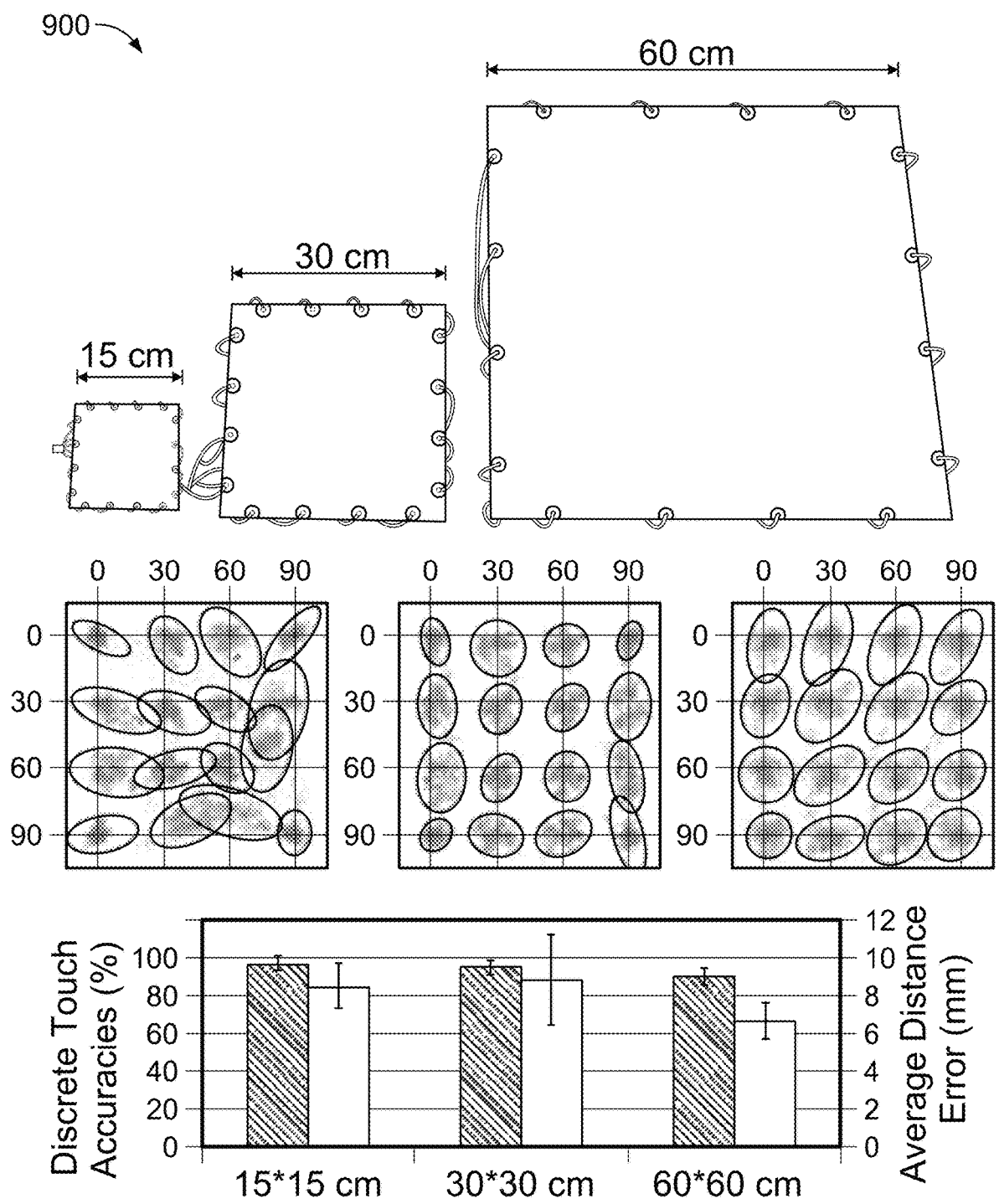
FIG. 9 shows testing panels and evaluation results for surface size experiment.

FIG. 9 shows the results 900 of the surface size experiment. The average classification accuracy for discrete touch locations was 93.0% (SD=14.3) and the mean continuous finger tracking distance error was 7.9 mm (SD=5.6). Larger surfaces tend to have more linear regression results, though there is no significant difference between the three conditions. This is probably not directly related to size per se, but rather ties into the earlier observation about electrode separation (i.e., as surface size increases, so does electrodes electrode separation, improving accuracy).

Figure 10:
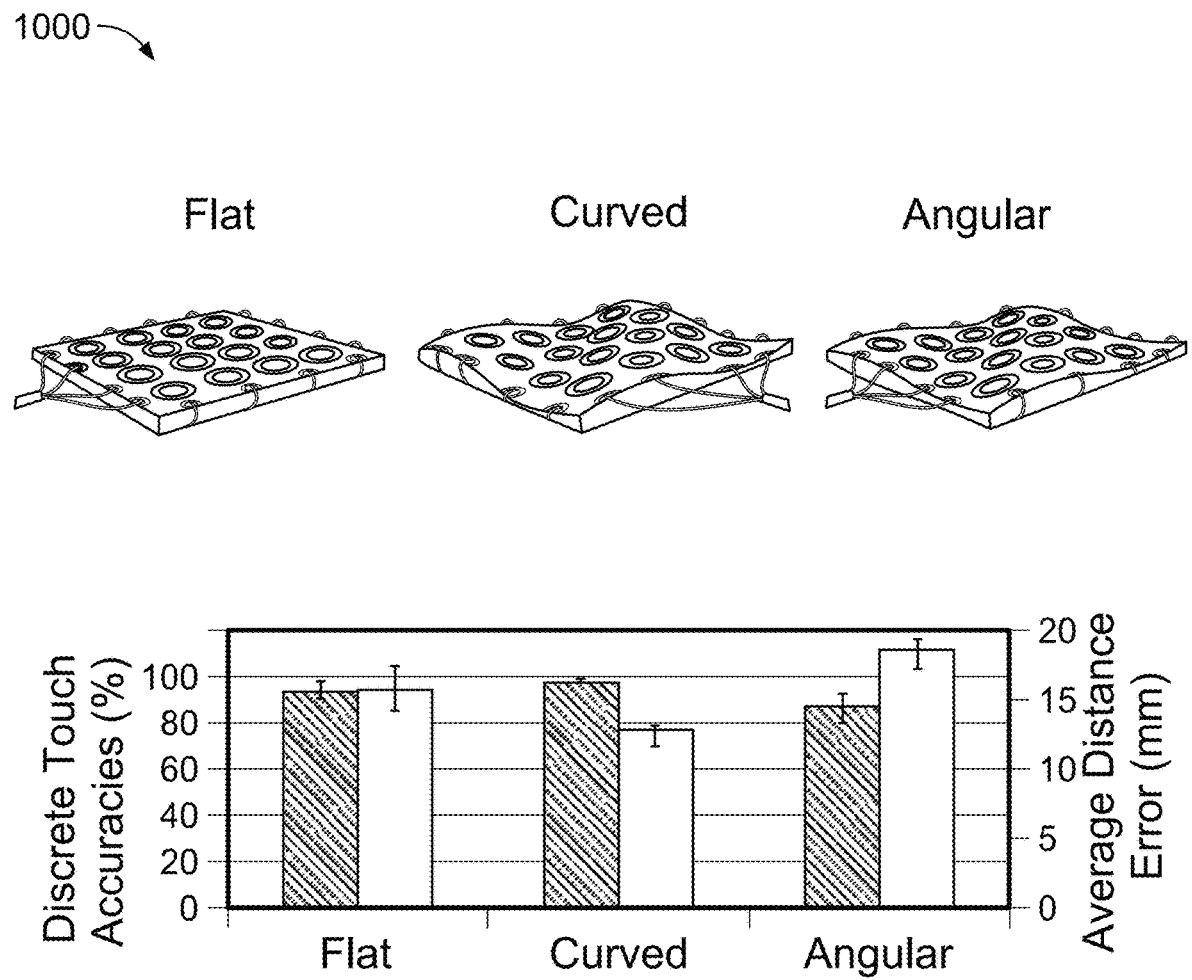
FIG. 10 shows testing panels and evaluation results for a geometry experiment.

The accuracy of the three surface geometry test conditions is shown in the data 1000 of FIG. 10, which indicates an average discrete touch accuracy of 92.9% (SD=9.8) and continuous touch tracking distance error is 15.7 mm (SD=3.5). There is no significant difference between conditions.

Figure 14:
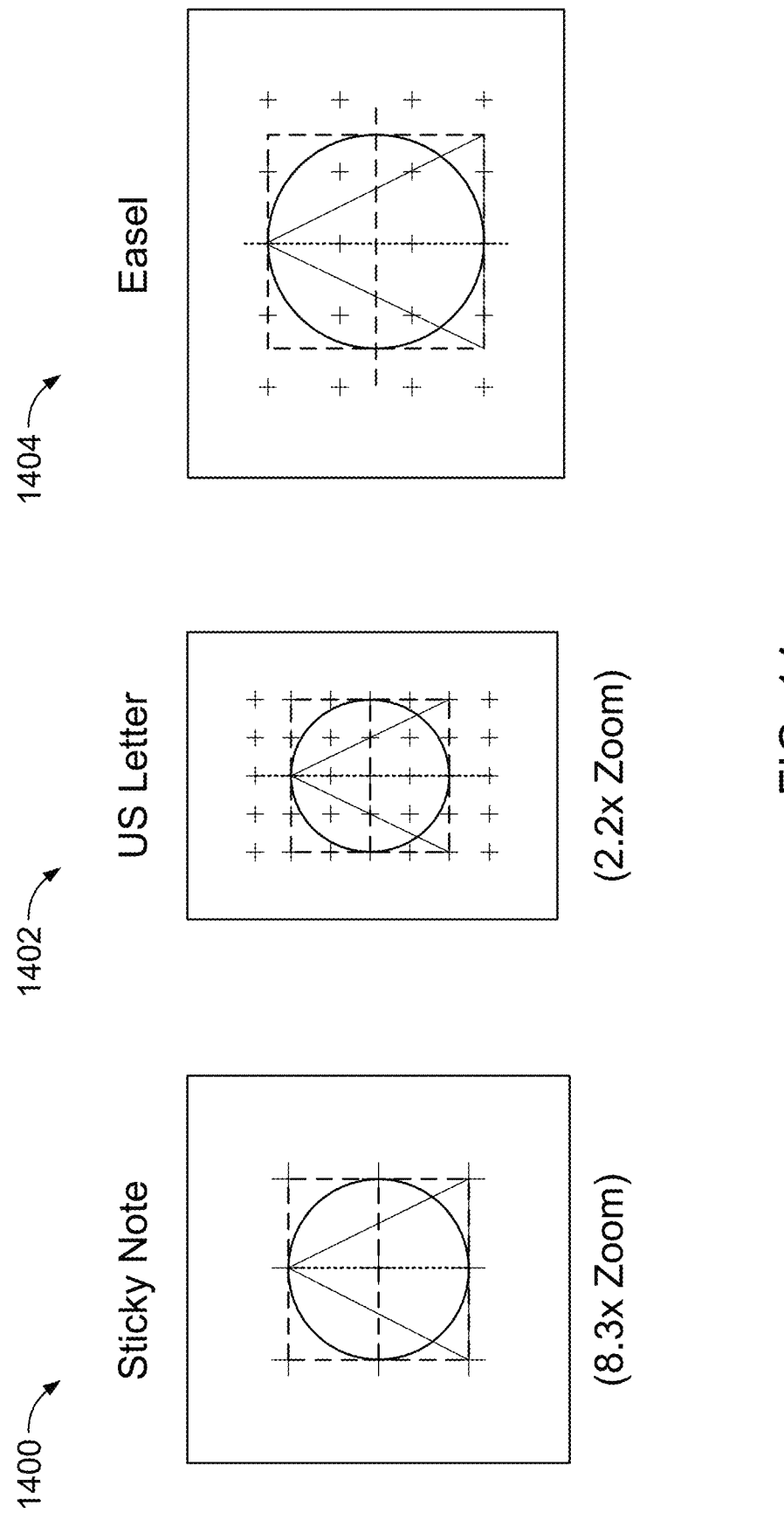
FIG. 14 shows examples of three touch sensitive papers for use with the touch sensing system of FIG. 1.

To verify that the touch-sensitive paper 120 works without any user or world calibration, the touch sensing system 100 can utilize a pre-trained model. The touch sensing system 100 was evaluated using three different paper sizes. The three sizes include U.S. letter 1402 (roughly equivalent to A4-sized paper), which is ubiquitous. The three sizes also included sticky notes 1400 and easel sheets 1404 (see Table 2 for dimensions). To standardize paper thicknesses, 16 lbs. US letter and easel paper was used in evaluation. The sticky-note note condition was cut from this larger stock. On each paper size, we printed a grid of crosshairs and five shapes (horizontal line, vertical line, circle, triangle and square). The number of crosshairs and the interval between them varied by paper size (see Table 2). These three paper conditions are shown in FIG. 14.

In addition to our three paper sizes, two example input modes are evaluated. The input modes that were evaluated include a finger input and a graphite pencil input, as described in relation to FIG. 13. Thus, six test conditions were evaluated, including sticky note paper and finger input, sticky note paper and pencil input, U.S. letter paper and finger input, U.S. letter paper and pencil input, easel paper and finger input, and easel paper and pencil input.

Figure 16:
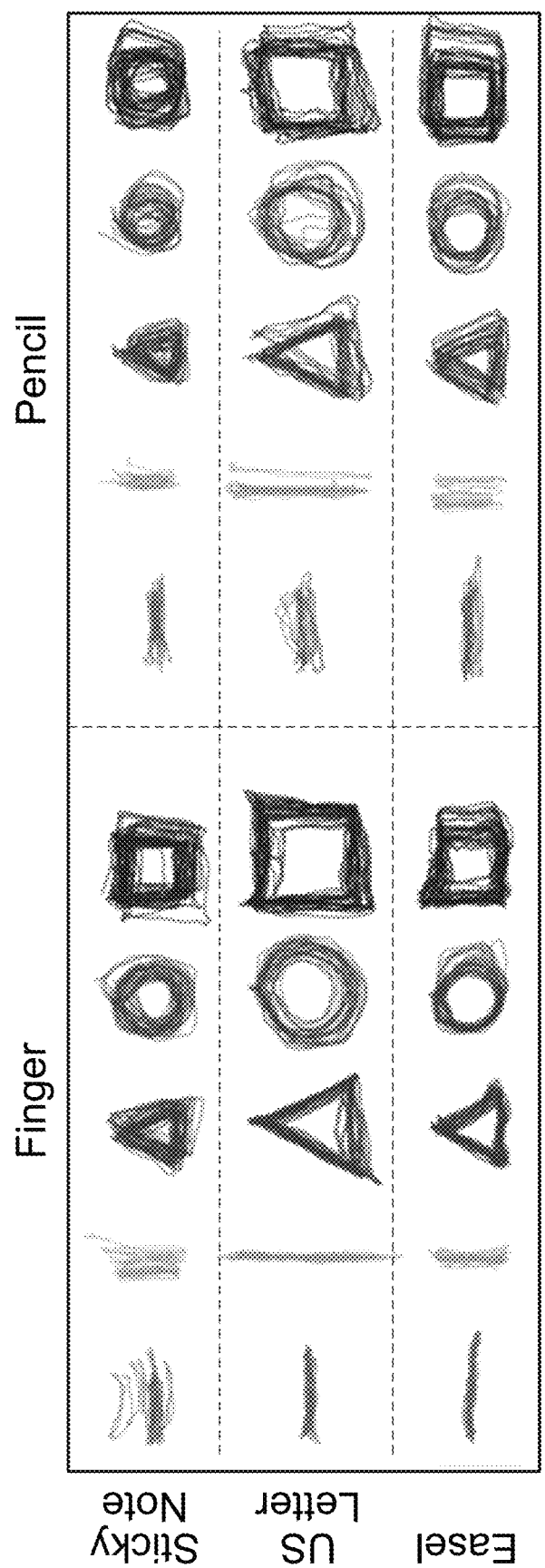
FIG. 16 includes a representation of uncorrected touch inputs for the touch-sensitive papers of FIG. 14.
Figure 17A:
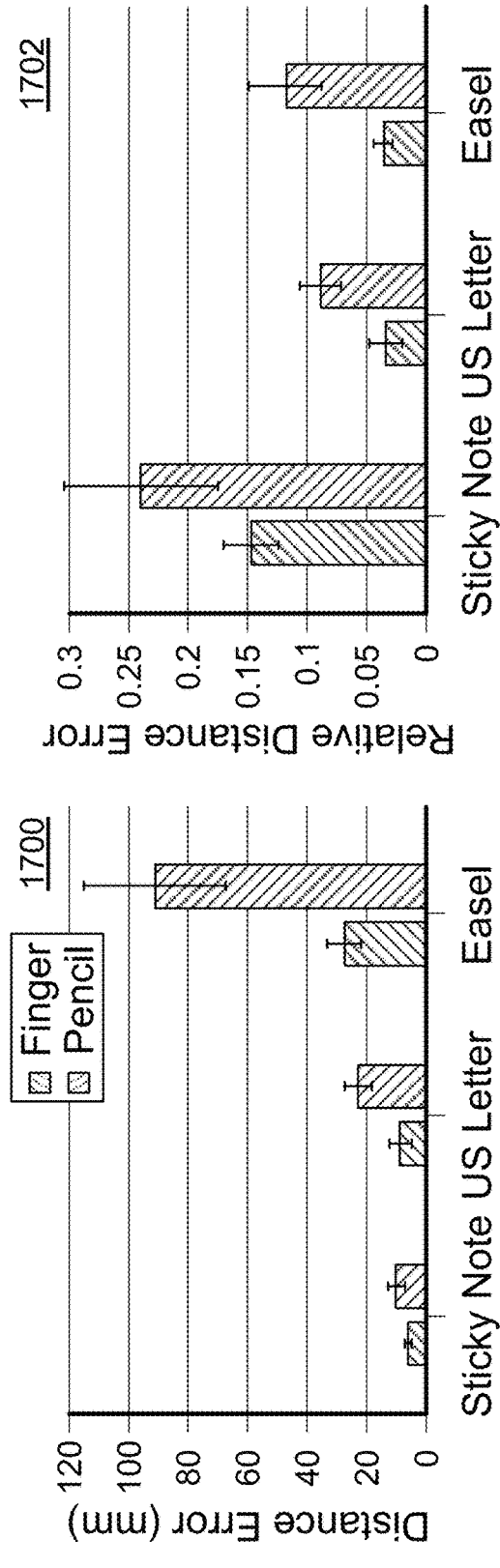
FIGS. 17A-17B include graphs showing error values for the touch sensing system for each of the touch-sensitive paper configurations of FIG. 14.
Figure 17B:
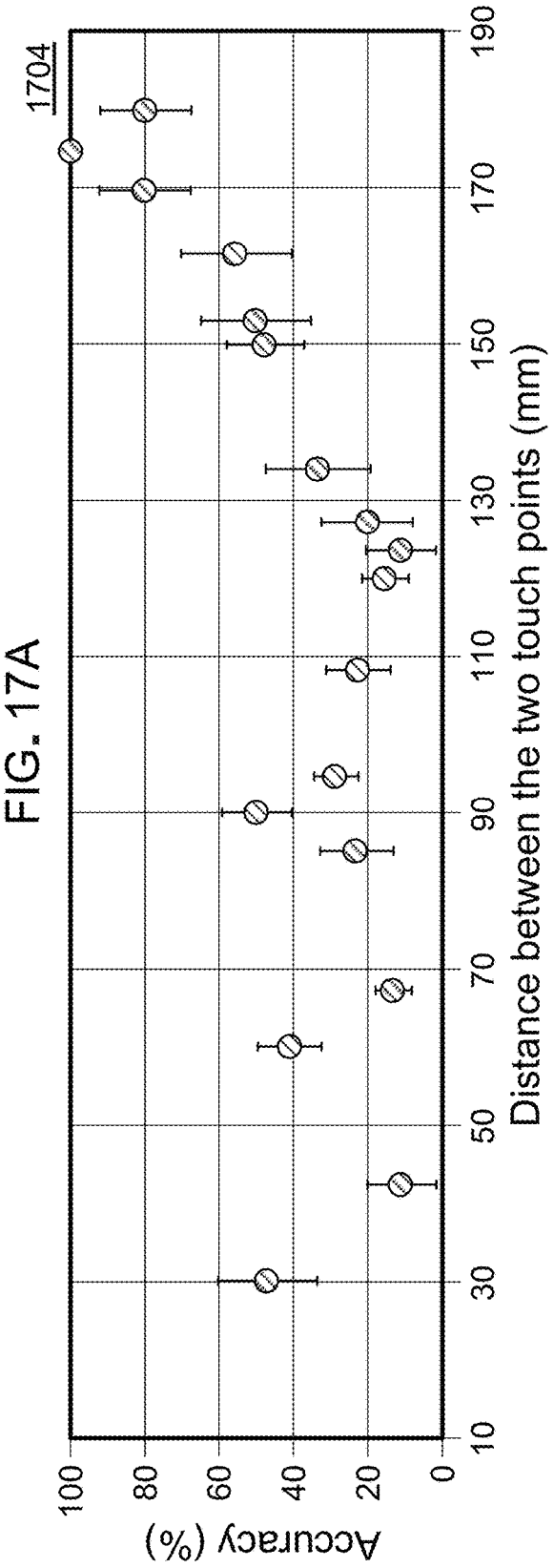

The touch sensing system 100 was tested with the same procedure for all six test conditions, the order of which was randomized. In each, participants clicked every crosshair, as instructed by a simple visualization running on a laptop. One round consisted of 30 trials of a participant keeping their hands away from the paper (i.e., no touch), and one trial of touching each crosshair (the number of which varied by paper size; see Table 2). Four rounds of this procedure were completed. The live output of our discrete classifiers and continuous touch tracking models was recorded. To specifically test continuous touch tracking, we included an additional experimental task in which participants traced shapes printed on our paper conditions, shown in the paper examples 1400, 1402, and 1404. Each shape was traced three times. In total, this procedure yielded 7920 no touch trials, 5632 crosshair click trials and 990 traced shape trials. The trace results 1600 of this experiment are shown in FIG. 16.

A motivation for running a user study—as opposed to a more straightforward technical evaluation—was to determine whether there are any per-user effects, stemming from variations in e.g., footwear, skin condition and hydration. These factors can affect capacitive coupling and grounding condition. However, these small user variances had no discernable effect on the touch sensing system 100 performance.

The first-level, touch/no-touch classifier achieved a mean accuracy of 97.2% across participants (SD=1.8). Of these errors, 2.5% of trials were classified as touches when no finger or pencil was touching the paper, and 0.2% actual touches were missed. There was no significant difference between conditions.

Figure 15:
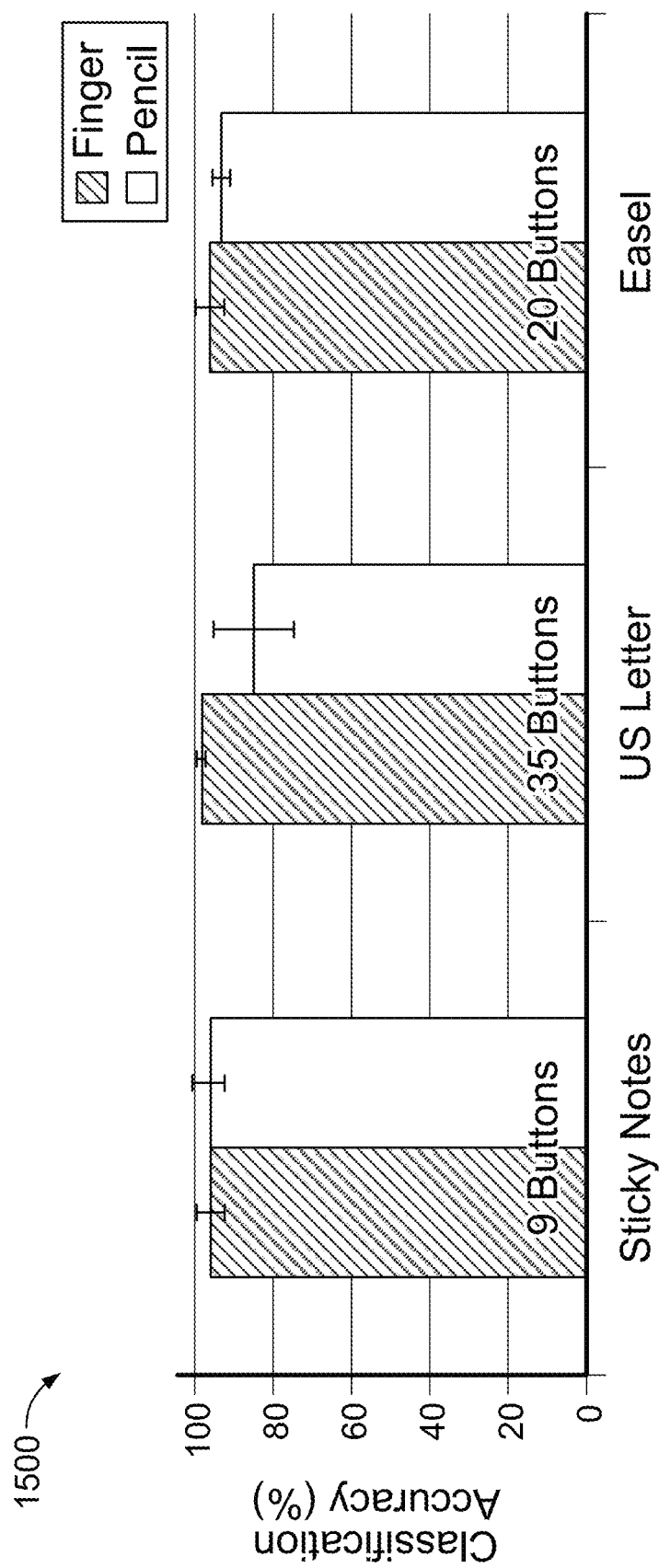
FIG. 15 includes a graph showing example classification accuracies for various configurations of the touch-sensitive papers of FIG. 14.

Discrete touch location classification was evaluated, as shown in graph 1500 of FIG. 15. When using a finger for input, our discrete touch location classifier 608 achieved an average accuracy of 96.8% (SD=2.8). This accuracy drops to 91.4% (SD=5.6) when using the pencil for input. A paired t-test shows this difference is only significant in the US Letter condition (p<0.05), which also had the highest number of discrete touch locations (35 classes).

Continuous Touch Tracking Accuracy was evaluated, as shown in results 1600 of FIG. 16. Strokes captured from all participants are overlaid, without correction. Overall, the touch sensing system 100 achieves a mean distance error of 14.3 mm (SD=3.5) when fingers are used. Pencil input (paired t-test, p<0.05) included a 41.6 mm mean distance error (SD=10.3). Turning to graph 1700 of FIG. 17A, it is apparent that error increases as paper size increases. Because different sizes of paper are used for different tasks (for example, precision tends to be greater on sticky notes than paper easels), the results are plotted relative to paper size in in graph 1702, which largely negates the error trend.

Two-point touch tracking was evaluated. The touch sensing system 100 was evaluated for the feasibility of basic multi-touch sensing, specifically two-point sensing (most common after single finger inputs). For this, the U.S. letter paper condition was applied and a simple visualization running on a laptop was executed that highlighted two crosshairs at random (e.g., a random separation distance) for the user to touch simultaneously in a bi-manual fashion. In total, 25 crosshair pairs were requested.

The machine learning module 600 was not designed for multiple touch points, so tomographic reconstruction was implemented in concert with standard blob tracking. Accuracy results are shown in graph 1704 of FIG. 17B. In general, touch points separated by at least 17 cm achieved segmentation accuracies exceeding 80%. In trials in which two fingers were correctly detected, results show a mean distance touch tracking error of 23.9 mm (SD=4.3).

In general, more electrodes result in a denser mesh of cross-sectional measurements, yielding higher tracking resolution. However, this only works up to a point, as electric field tomography suffers from a soft field problem caused by non-linear electrical paths with incomplete occlusion (unlike e.g., optical sensing). This causes any shutting point to affect measurements at all electrodes, which undermines the benefit of higher electrode count. Additionally, more electrodes increase the number of measurements needed per frame, reducing frame rate. For the touch sensing system 100, 16 electrodes was used to optimize accuracy and framerate. However, touch sensing system 100 with improved sampling rate and sensitivity can benefit from higher electrode counts.

The touch sensing system 100 including the touch-sensitive paper 120 includes a quick and easy way to connect the touch-sensitive paper to the sensing board 200. A chip or other connector is possible. In some implementations, the electronics can be included directly in the paper. This has already been demonstrated with e-Ink displays for magazine covers, singing birthday cards, and RFID tags, all of which contain simple microprocessors so inexpensive they can be discarded.

The touch-sensitive paper 120 can include double-sided paper. While prototype sheets were single-sided (paper on one side, conductive layer on the other), double-sided touch-sensitive paper 120 can be achieved by sandwiching the conductive layer between two sheets of paper.

The feasibility of recycling the touch-sensitive paper 120 was investigated. The paint-coated sheets are recyclable through conventional solvent solvent-based methods used to wash ink from recycled pulp. The plastic-backed sheets would likely go through similar separation processes as other plastic laminated paper products, such as juice cartons and disposable serving containers. The latter process could be facilitated by using a dissolvable adhesive between conductive and paper layers.

Electromagnetic noise emitted by power lines, fluorescent lights, and electronic appliances can affect the tracking accuracy of the touch sensing system 100. To mitigate this interference, the sensor board 200 includes a high pass filter before the ADC preamp.

To improve grounding conditions, and thus increase shunt current magnitude, an ADC preamp with large input impedance is included (e.g., to improve SNR). Finger input to the touch sensing system 100 is reliable irrespective of grounding condition. The added impedance when using a writing implement is improved with increasing the grounding condition of the touch sensing system 100 (e.g., connecting the touch sensing system to earth ground).

Figure 18:
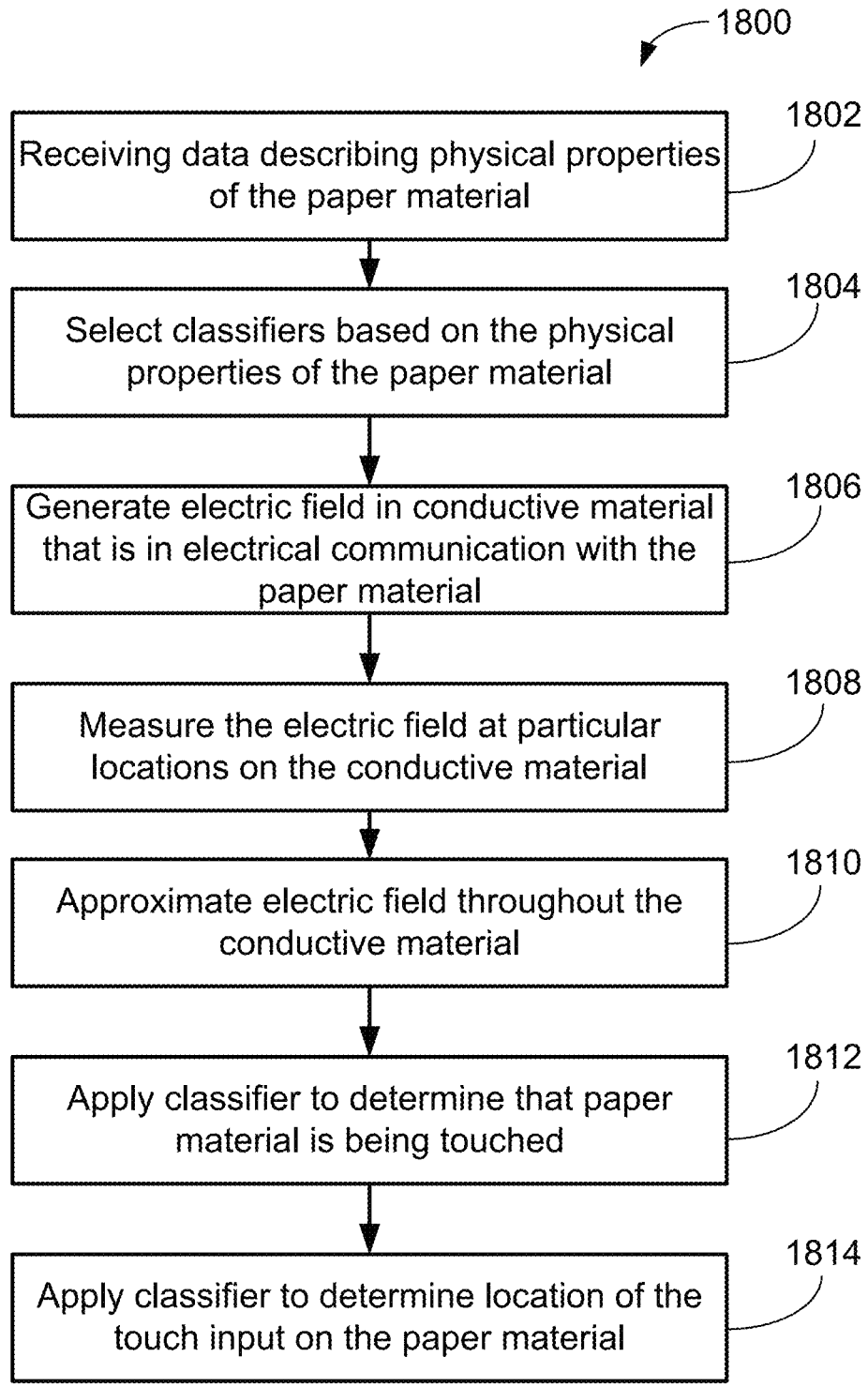
FIG. 18 shows an example process for detecting touch inputs by the touch sensing system of FIG. 1.

Turning to FIG. 18, a process 1800 is described for determining, by a touch sensing system (e.g., touch sensing system 100 of FIG. 1), a location of a touch input on the touch-sensitive paper 120. The process 1800 includes receiving (1802) data comprising one or more values of features representing physical properties of a paper material. The values of features can include dimensions of the paper material, thickness, composition, and so forth. The process 1800 includes selecting (1804) a first classifier based on the one or more values of the features representing the physical properties of the paper material. The first classifier includes a touch-state classifier configured to determine whether the paper material is being touched at all or if the paper material is not being touched by a writing instrument, user, etc. The process 1800 includes selecting (1804) a second classifier based on the one or more values of the features representing the physical properties of the paper material. The second classifier includes a location classifier configured to determine where on the touch-sensitive paper 120 (e.g., what location or locations) is being touched. The classifier depends on the features of the touch-sensitive paper 120 and is calibrated based on the features of the touch-sensitive paper 120. For example, the electric field is altered differently with a thicker touch-sensitive paper 120 than a thinner touch-sensitive paper 120. The classifiers are each calibrated to different features and combinations of features. Thus, they are configured to determine that a change of the electric field in the conductive material represents a touch, and where that touch is located on the touch-sensitive paper 120. The process 1800 includes generating (1806), by a first pair of electrodes at a first location in a conductive material that is in electrical communication with the touch-sensitive paper 120, an electric field in the conductive material. The touch-sensitive paper 120 configured to shunt current from the conductive material when the touch-sensitive paper is touched, as previously described. Generally, the touch-sensitive paper 120 is configured to shunt current from the conductive material prior to operation of the touch sensing system 100. The touch sensing system 100 is configured to generate (1808) measurement data by measuring, by one or more second pairs of electrodes, the electric field in the conductive material at one or more second locations in the conductive material. The process 1800 includes generating (1810), based on the measurement data, an approximation of the electric field at a third location in the conductive material. The approximation can include a reconstruction of the electric field in the conductive material based on the FEM of the touch-sensitive paper 120 being used. The process 1800 includes applying (1812) the first classifier to the approximation of the electric field at the third location to determine a state of the paper material at the third location. Generally, the third location can be anywhere on the touch-sensitive paper 120, but does not need to be near or at the second location of the measuring electrodes or near to or at the first location of the current-emitting electrodes. The touch sensing system 100 is configured to in response to determining the state of the paper material, apply (1814) the second classifier to the approximation of the electric field at the third location to determine the location of the touch input on the paper material. As discussed above, the classifiers can be applied using neural network, support vector machines, linear regression, and so forth. Once the location of the touch input on the touch-sensitive paper 120 is determined, the touch sensing system 100 can perform any number of applications as described previously.

Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible program carrier for execution by, or to control the operation of, a processing device. Alternatively, or in addition, the program instructions can be encoded on a propagated signal that is an artificially generated signal, e.g., a machine-generated electrical, optical, or electromagnetic signal that is generated to encode information for transmission to suitable receiver apparatus for execution by a processing device. A machine-readable medium can be a machine-readable storage device, a machine-readable storage substrate, a random or serial access memory device, or a combination of one or more of them.

The term "processing device" encompasses apparatuses, devices, and machines for processing information, including by way of example a programmable processor, a computer, or multiple processors or computers. The apparatus can include special purpose logic circuitry, e.g., an FPGA (field programmable gate array) or an ASIC (application specific integrated circuit) or RISC (reduced instruction set circuit). The apparatus can also include, in addition to hardware, code that creates an execution environment for the computer program in question, e.g., code that constitutes processor firmware, a protocol stack, an information base management system, an operating system, or a combination of one or more of them.

A computer program (which may also be referred to as a program, software, a software application, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or information (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input information and generating output. The processes and logic flows can also be performed by, and apparatus can also be implemented as, special purpose logic circuitry, e.g., an FPGA (field programmable gate array) or an ASIC (application specific integrated circuit) or RISC.

Computers suitable for the execution of a computer program include, by way of example, general or special purpose microprocessors or both, or any other kind of central processing unit. Generally, a central processing unit will receive instructions and information from a read only memory or a random access memory or both. The essential elements of a computer are a central processing unit for performing or executing instructions and one or more memory devices for storing instructions and information. Generally, a computer will also include, or be operatively coupled to receive information from or transfer information to, or both, one or more mass storage devices for storing information, e.g., magnetic, magneto optical disks, or optical disks. However, a computer need not have such devices. Moreover, a computer can be embedded in another device, e.g., a mobile telephone, a smartphone or a tablet, a touch-screen device or surface, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and information include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and (Blue Ray) DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Figure 19:
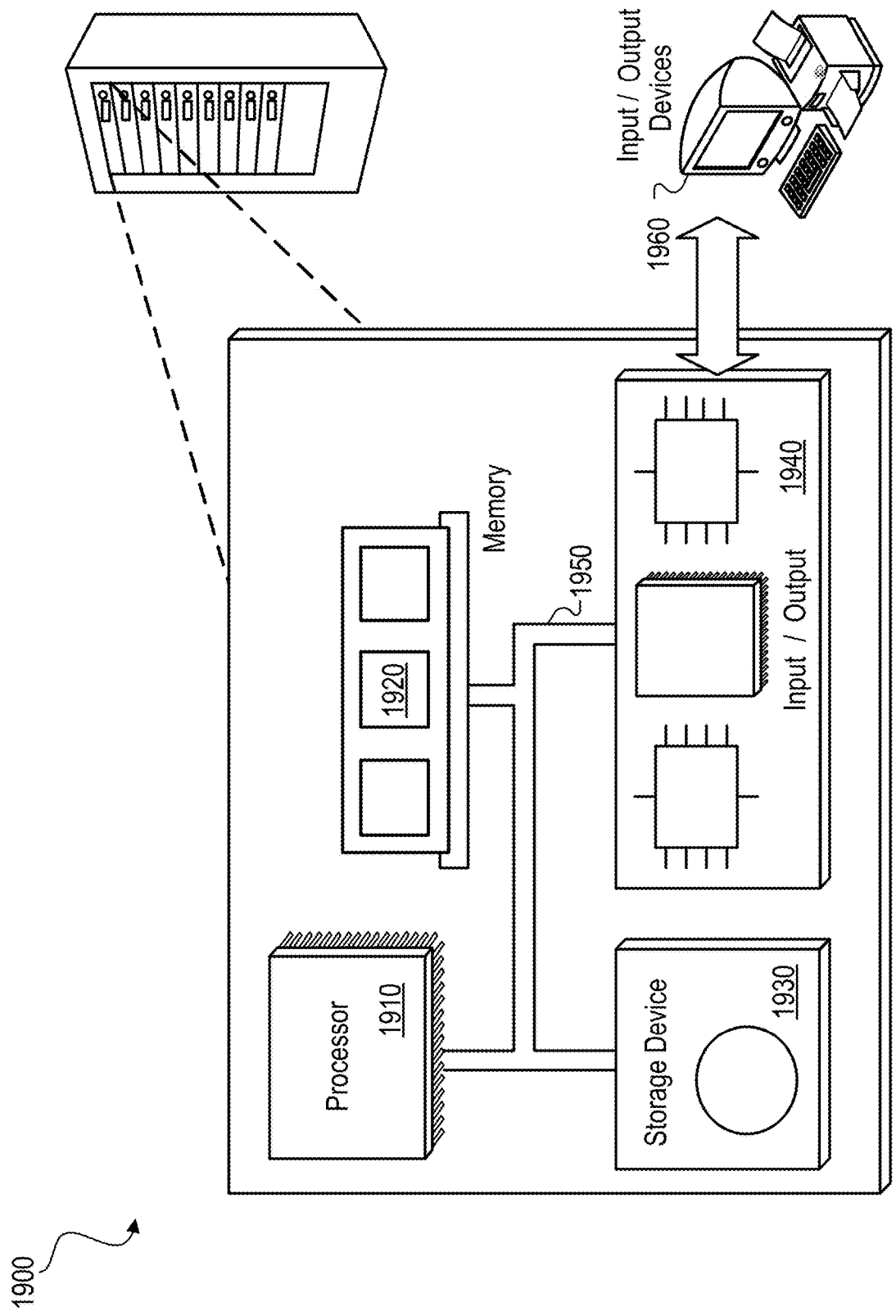
FIG. 19 includes a block diagram of an example computing system of the touch sensing system of FIG. 1.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other. FIG. 19 shows an example computer system 1900 that includes a processor 1910, a memory 1920, a storage device 1930 and an input/output device 1940. Each of the components 1910, 1920, 1930 and 1940 can be interconnected, for example, by a system bus 1950. The processor 1910 is capable of processing instructions for execution within the system 1900. In some implementations, the processor 1910 is a single-threaded processor, a multi-threaded processor, or another type of processor. The processor 1910 is capable of processing instructions stored in the memory 1920 or on the storage device 1930. The memory 1920 and the storage device 1930 can store information within the system 1900.

The input/output device 1940 provides input/output operations for the system 1900. In some implementations, the input/output device 1940 can include one or more of a network interface device, e.g., an Ethernet card, a serial communication device, e.g., an RS-232 port, and/or a wireless interface device, e.g., an 802.11 card, a 3G wireless modem, a 4G wireless modem, a 5G wireless modem, etc. In some implementations, the input/output device can include driver devices configured to receive input data and send output data to other input/output devices, e.g., keyboard, printer and display devices 1960. In some implementations, mobile computing devices, mobile communication devices, and other devices can be used.

While this specification includes many specific implementation details, these should not be construed as limitations on the scope of any of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method for determining a state of a paper material indicative of a touch input on the paper material, the method comprising:
   receiving, at a computing system, data comprising one or more values of features representing physical properties of a paper material including paper and a conductive material coupled with the paper material, the paper material being removable from a signal generator associated with a computing system;
   generating, by the signal generator associated with the computing system and connected to a first pair of electrodes at a first location in the conductive material that is coupled with the paper material, an electric field in the conductive material, the paper material being configured to shunt current from the conductive material when the paper material is touched;
   generating measurement data by measuring, by one or more second pairs of electrodes, the electric field in the conductive material at one or more second locations in the conductive material;
   generating, based on the measurement data, an approximation of the electric field in the conductive material;
   selecting a classifier based on the one or more values of the features representing the physical properties of the paper material and the approximation of the electric field in the conductive material; and
   determining, based on applying the classifier to the approximation of the electric field, a state of the paper material indicative of a touch input on the paper material.

2. The method of claim 1, wherein the state of the paper material indicative of the touch input on the paper material is determined to be either touched or not touched.

3. The method of claim 2, wherein the method further comprises:
   in response to determining that the state of the paper material is touched, determining the location of the touch input on the paper material.

4. The method of claim 3, wherein the classifier comprises a first classifier configured for determining the state of the paper material as touched or not touched, and wherein the classifier comprises a second classifier for determining the location of the touch input on the paper material, the first classifier being different from the second classifier.

5. The method of claim 3, wherein determining the location of the paper material that is touched includes a tracking of a continuous touch on the paper material.

6. The method of claim 3, wherein determining the location of the touch input on the paper material comprises determining a location of a disturbance in the electric field of the conductive material that causes the electric field to diverge, at the location of the disturbance, from a baseline electric field of the conductive material.

7. The method of claim 6, wherein the disturbance in the electric field is caused by an electric current that is shunted at the location of the disturbance.

8. The method of claim 7, wherein the electric current is shunted by a user's touch.

9. The method of claim 7, wherein the electric current is shunted by a writing instrument.

10. The method of claim 6, further comprising:
    determining the baseline electric field of the conductive material by obtaining the measurement data when the paper material is not being touched.

11. The method of claim 1, further comprising:
    in response to generating the measurement data, selecting one of the one or more second pairs of electrodes for generating another electric field in the conductive material;
    generating additional measurement data, using the first pair of electrodes and the one or more second pairs of electrodes that were not selected; and
    combining the measurement data with the additional measurement data to generate cross-sectional measurement data;
    wherein the approximation of the electric field is based on the cross-sectional measurement data.

12. The method of claim 1, wherein the data comprising the one or more values of features representing physical properties of the paper material comprises a finite element model (FEM) of the paper material.

13. The method of claim 1, wherein generating the measurement data comprises a tomographic reconstruction of the electric field throughout the conductive material.

14. The method of claim 1, further comprising:
    applying a first regression model for a first dimension of the paper material and applying a second regression model for a second dimension of the paper material.

15. The method of claim 1, wherein applying the classifier comprises executing a neural network to perform operations comprising:
    generating feature inputs each comprising a sample of the measurement data;
    generating weights data based on the data comprising the one or more values of the features representing physical properties of the paper material;
    combining, at each stage of the neural network, each of the feature inputs with the weights data to generate output data; and
    applying the classifier to the output data.

16. The method of claim 1, further comprising executing a support vector machine, wherein one or more features of the support vector machine comprise the measurement data.

17. The method of claim 1, wherein the conductive material comprises a surface coat material having a resistivity between 500Ω and 50MΩ.

18. The method of claim 1, further comprising:
multiplexing the first pair of electrodes and the one or more second pairs of electrodes between a current generating state and a voltage measuring state.

19. The method of claim 1, further comprising:
determining, based on applying the classifier, that two or more regions of the paper material are simultaneously being touched.

20. The method of claim 1, wherein a physical property of the paper material comprise one or more of a resistivity, a thickness, a material type, a shape, and a size.

21. A method for determining a state of a paper material indicative of a touch input on the paper material, the method comprising:
receiving data comprising one or more values of features representing physical properties of a paper material;
generating, by a first pair of electrodes at a first location in a conductive material that is electrically connected with the paper material, an electric field in the conductive material, the paper material being configured to shunt current from the conductive material when the paper material is touched;
generating measurement data by measuring, by one or more second pairs of electrodes, the electric field in the conductive material at one or more second locations in the conductive material;
generating, based on the measurement data, an approximation of the electric field in the conductive material;
selecting a classifier based on the one or more values of the features representing the physical properties of the paper material and the approximation of the electric field in the conductive material;
applying a first regression model for a first dimension of the paper material and applying a second regression model for a second dimension of the paper material; and
determining, based on applying the classifier to the approximation of the electric field, a state of the paper material indicative of a touch input on the paper material.

\* \* \* \* \*

UNITED STATES PATENT AND TRADEMARK OFFICE
CERTIFICATE OF CORRECTION

PATENT NO. : 11,481,077 B2
APPLICATION NO. : 16/978954
DATED : October 25, 2022
INVENTOR(S) : Christopher Harrison and Yang Zhang Page 1 of 1

It is certified that error appears in the above-identified patent and that said Letters Patent is hereby corrected as shown below:

On the Title Page

Item (57), Column 2, Lines 10-11, delete "in the conductive material in the conductive material." and insert -- in the conductive material. --

Signed and Sealed this
Twenty-fourth Day of January, 2023

Katherine Kelly Vidal
*Director of the United States Patent and Trademark Office*